US011515330B2

(12) United States Patent
Chen

(10) Patent No.: US 11,515,330 B2
(45) Date of Patent: Nov. 29, 2022

(54) THREE-DIMENSIONAL FERROELECTRIC RANDOM-ACCESS MEMORY (FERAM)

(71) Applicant: Yung-Tin Chen, Santa Clara, CA (US)

(72) Inventor: Yung-Tin Chen, Santa Clara, CA (US)

( * ) Notice: Subject to any disclaimer, the term of this patent is extended or adjusted under 35 U.S.C. 154(b) by 233 days.

(21) Appl. No.: 16/558,072

(22) Filed: Aug. 31, 2019

(65) Prior Publication Data

US 2020/0357821 A1 Nov. 12, 2020

Related U.S. Application Data

(60) Provisional application No. 62/846,418, filed on May 10, 2019.

(51) Int. Cl.
| H01L 29/66 | (2006.01) |
| H01L 27/11597 | (2017.01) |
| H01L 29/78 | (2006.01) |
| H01L 27/1159 | (2017.01) |

(52) U.S. Cl.
CPC .... *H01L 27/11597* (2013.01); *H01L 27/1159* (2013.01); *H01L 29/6684* (2013.01); *H01L 29/78391* (2014.09)

(58) Field of Classification Search
CPC combination set(s) only.
See application file for complete search history.

(56) References Cited

U.S. PATENT DOCUMENTS

| 5,046,043 A | 9/1991 | Miller et al. |
| 6,067,244 A | 5/2000 | Ma et al. |
| 9,892,800 B2 | 2/2018 | Harari |
| 10,121,553 B2 | 11/2018 | Harari et al. |
| 10,121,554 B2 | 11/2018 | Harari |
| 10,249,370 B2 | 4/2019 | Harari et al. |
| 2007/0243641 A1 | 10/2007 | Son et al. |

(Continued)

OTHER PUBLICATIONS

"Invitation to Pay Additional Fees, PCT/US2020/032200", dated Jul. 9, 2020, 2 pages.

(Continued)

*Primary Examiner* — Moin M Rahman
(74) *Attorney, Agent, or Firm* — Edward C. Kwok; VLP Law Group LLP

(57) ABSTRACT

A 3-dimensional vertical memory string array includes high-speed ferroelectric field-effect transistor (FET) cells that are low-cost, low-power, or high-density and suitable for SCM applications. The memory circuits of the present invention provide random-access capabilities. The memory string may be formed above a planar surface of substrate and include a vertical gate electrode extending lengthwise along a vertical direction relative to the planar surface and may include (i) a ferroelectric layer over the gate electrode, (ii) a gate oxide layer; (iii) a channel layer provided over the gate oxide layer, and (iv) conductive semiconductor regions embedded in and isolated from each other by an oxide layer, wherein the gate electrode, the ferroelectric layer, the gate oxide layer, the channel layer and each adjacent pair of semiconductor regions from a storage transistor of the memory string, and wherein the adjacent pair of semiconductor regions serve as source and drain regions of the storage transistor.

22 Claims, 42 Drawing Sheets

(56) References Cited

U.S. PATENT DOCUMENTS

| | | | |
|---|---|---|---|
| 2013/0069152 A1* | 3/2013 | Lee | H01L 29/0847 |
| | | | 257/335 |
| 2014/0061752 A1* | 3/2014 | Omoto | H01L 27/11565 |
| | | | 257/314 |
| 2015/0076437 A1* | 3/2015 | Tao | H01L 45/14 |
| | | | 257/4 |
| 2016/0099256 A1* | 4/2016 | Okamoto | H01L 27/11582 |
| | | | 438/587 |
| 2016/0111517 A1 | 4/2016 | Wu et al. | |
| 2017/0103988 A1 | 4/2017 | Nishida et al. | |
| 2018/0076210 A1* | 3/2018 | Hamada | H01L 27/11582 |
| 2018/0350940 A1* | 12/2018 | Yoo | H01L 29/516 |
| 2018/0366547 A1 | 12/2018 | Liu et al. | |
| 2019/0006376 A1 | 1/2019 | Ramaswamy | |
| 2019/0165126 A1* | 5/2019 | Chen | H01L 27/0886 |
| 2019/0312050 A1 | 10/2019 | Lai et al. | |

OTHER PUBLICATIONS

Boscke, T.S., et al., "Ferroelectricity in hafnium oxide thin films", Applied Physics Letters 99, 102903, 2011, 102903-1 to -3.

Boscke, T.S., et al., "Ferroelectricity in Hafnium Oxide: CMOS compatible Ferroelectric Field Effect Transistors", IEEE, 978-1-4577-0505-2, pp. 24.5.1-24.5.4.

Cheng, Chun-Hu, et al., "Low-Leakage-Current DRAM-Like Memory Using a One-Transistor Ferroelectric MOSFET With a Hf-Based Gate Dielectric", IEEE Electronic Device Letters, vol. 35, No. 1,, 2014, pp. 138-140.

Chiu, Yu-Chien, et al., "Low Power 1T DRAM/NVM Versatile Memory Featuring Steep Sub-60-mV/decade Operation, Fast 20-ns Speed, and Robust 85oC-Extrapolated 1016 Endurance", Symposium on VLSI Technology Digest of Technical Papers, 2015, pp. T184-T185.

Luo, Qing, et al., "Hybrid 1T e-DRAM and e-NVM Realized in One 10 nm node Ferro FinFET device with Charge Trapping and Domain Switching Effects", IEEE, 978-1-7281-1987-8, 2018, pp. 2.6.1-2.6.4.

Mueller, J., et al., "Ferroelectric Hafnium Oxide Based Materials and Devices: Assessment of Current Status and Future Prospects", ECS Journal of Solid State Science and Technology, 4 (5), 2015, pp. N30-35.

Mueller, J., et al., "Ferroelectric Hafnium Oxide: A CMOS-compatible and highly scalable approach to future ferroelectric memories", IEEE-978-1-4799-2306-9/13, 2013, pp. 10.8.1-10.8.4.

Mueller, J., et al., "Ferroelectricity in HfOz enables nonvolatile data storage in 28 nm HKMG", Symposium on VLSI Technology Digest of Technical Papers, 2012, pp. 25-26.

Mueller, J., et al., "Ferroelectricity in yttrium-doped hafnium oxide", Journal of Applied Physics 110, 114113, 2011, pp. 114113-1 to 5.

Mueller, S., et al., "Next-Generation Ferroelectric Memories Based on Fe—HfO2", IEEE-978-1-4799-9974-3/15, 2015, pp. 233-236.

Schenk, T., et al., "Strontium Doped Hafnium Oxide Thin Films-Wide Process Window for Ferroelectric Memories", ESSDERC, Bucharest, Sep. 18, 2013, pp. 1-30.

"PCT Search Report and Written Opinion, PCT/US2020/032200", dated Sep. 24, 2020, 16 pages.

* cited by examiner

FIG. 4d (ii)

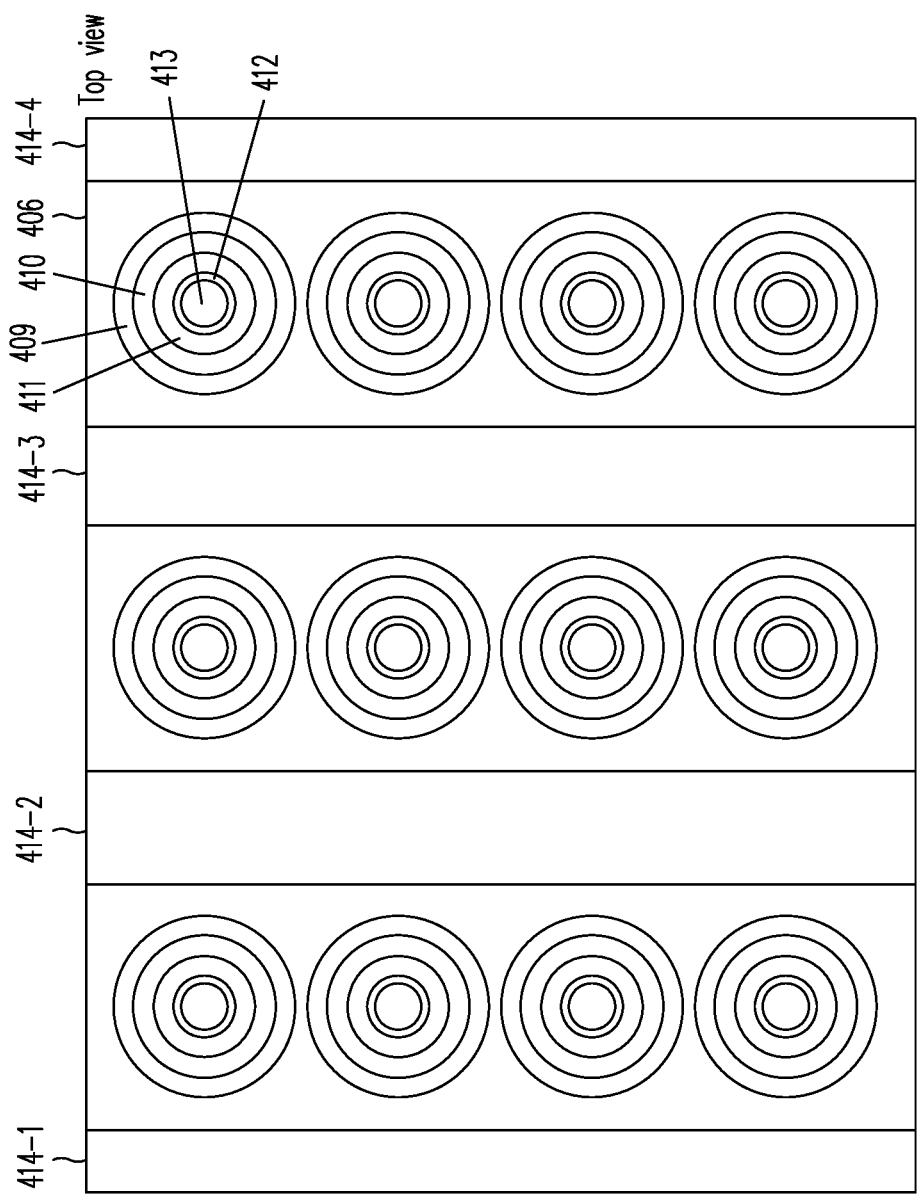
FIG. 4h (iii)

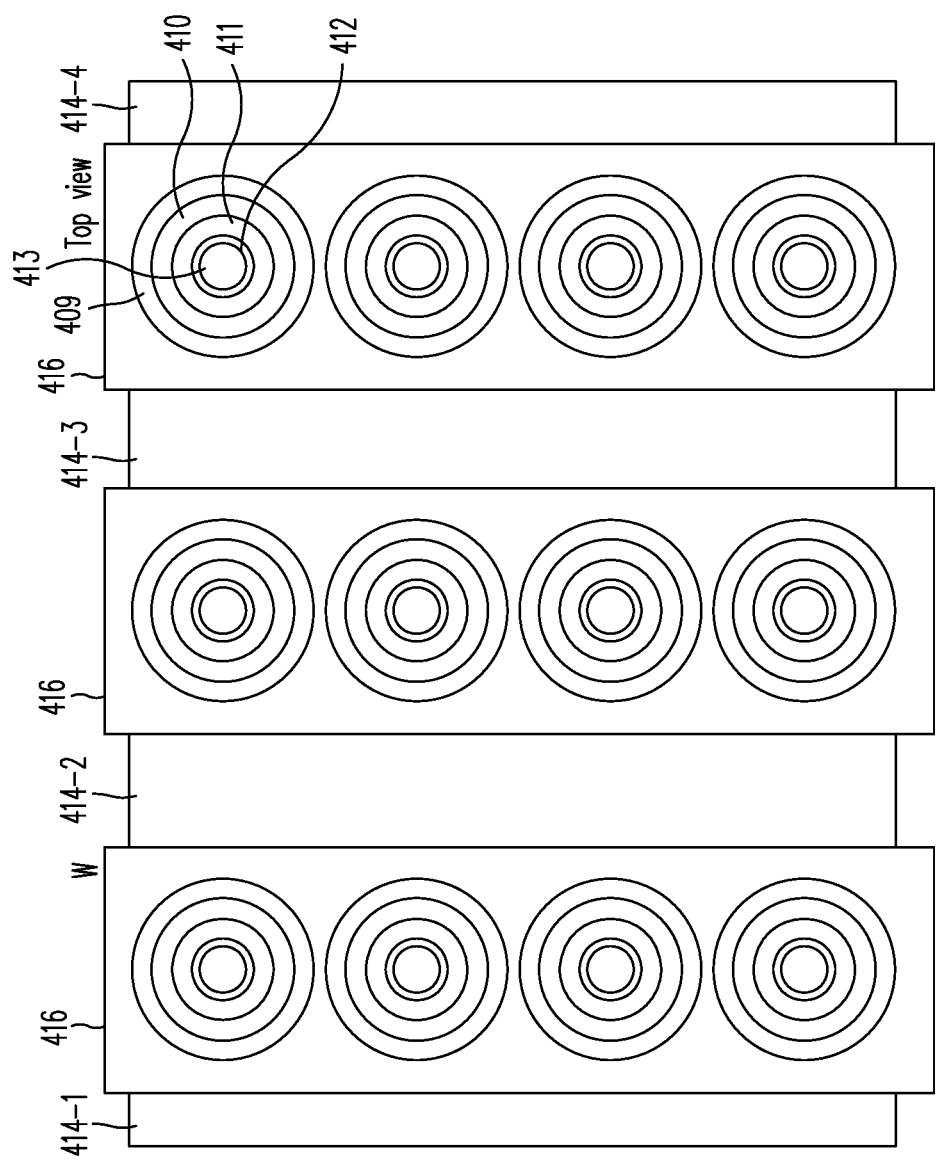
FIG. 4i (ii)

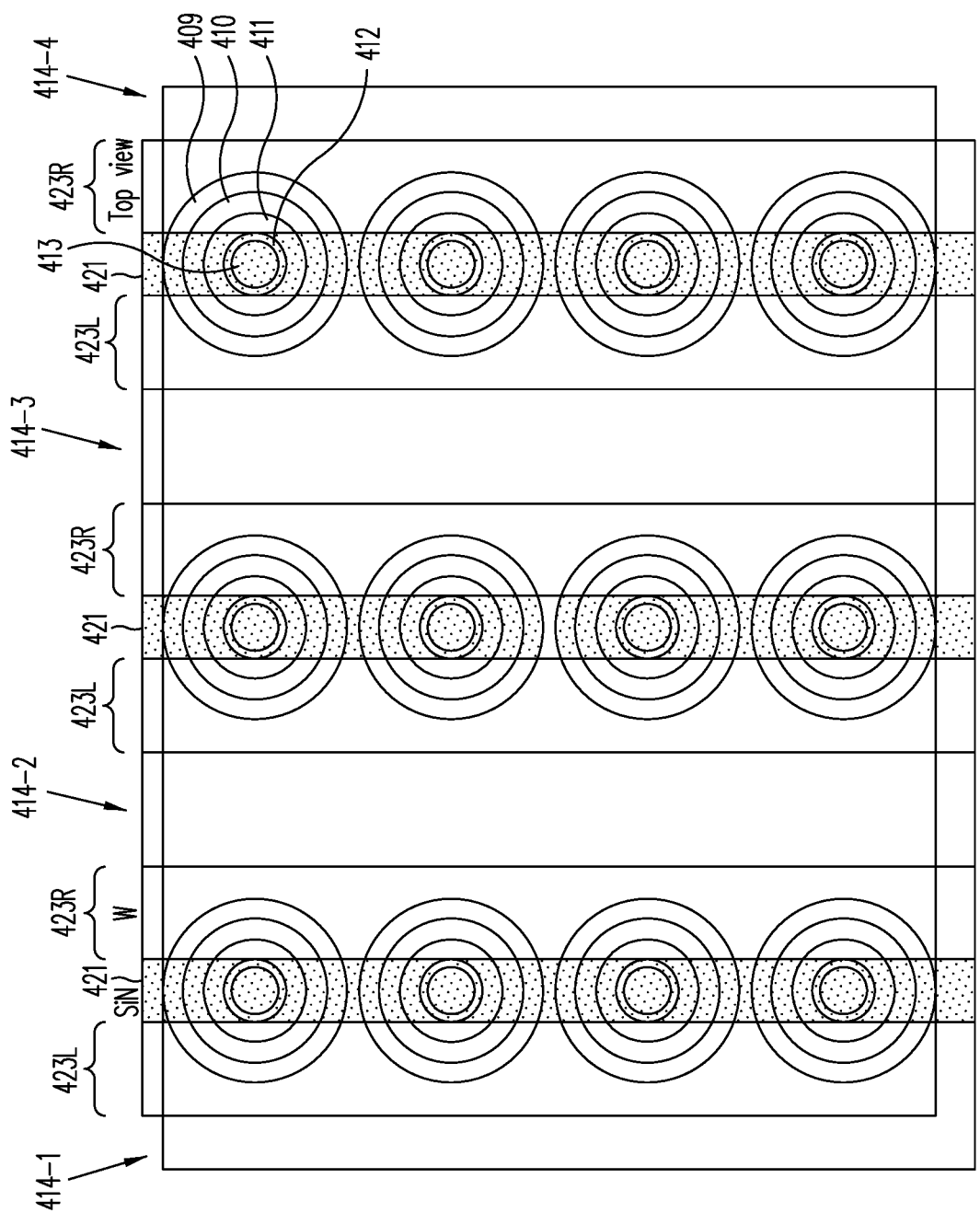
FIG. 4j (ii)

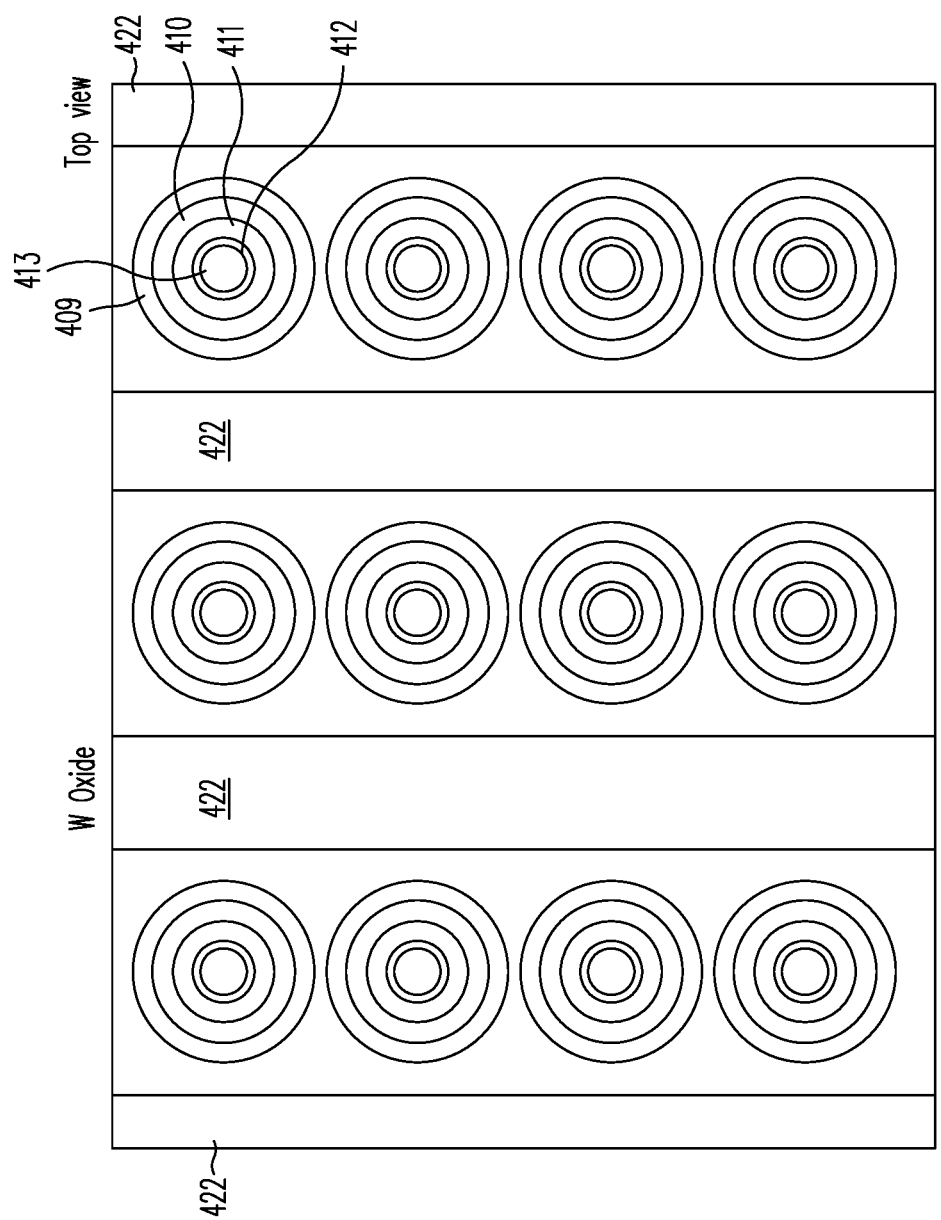
FIG. 4k (ii)

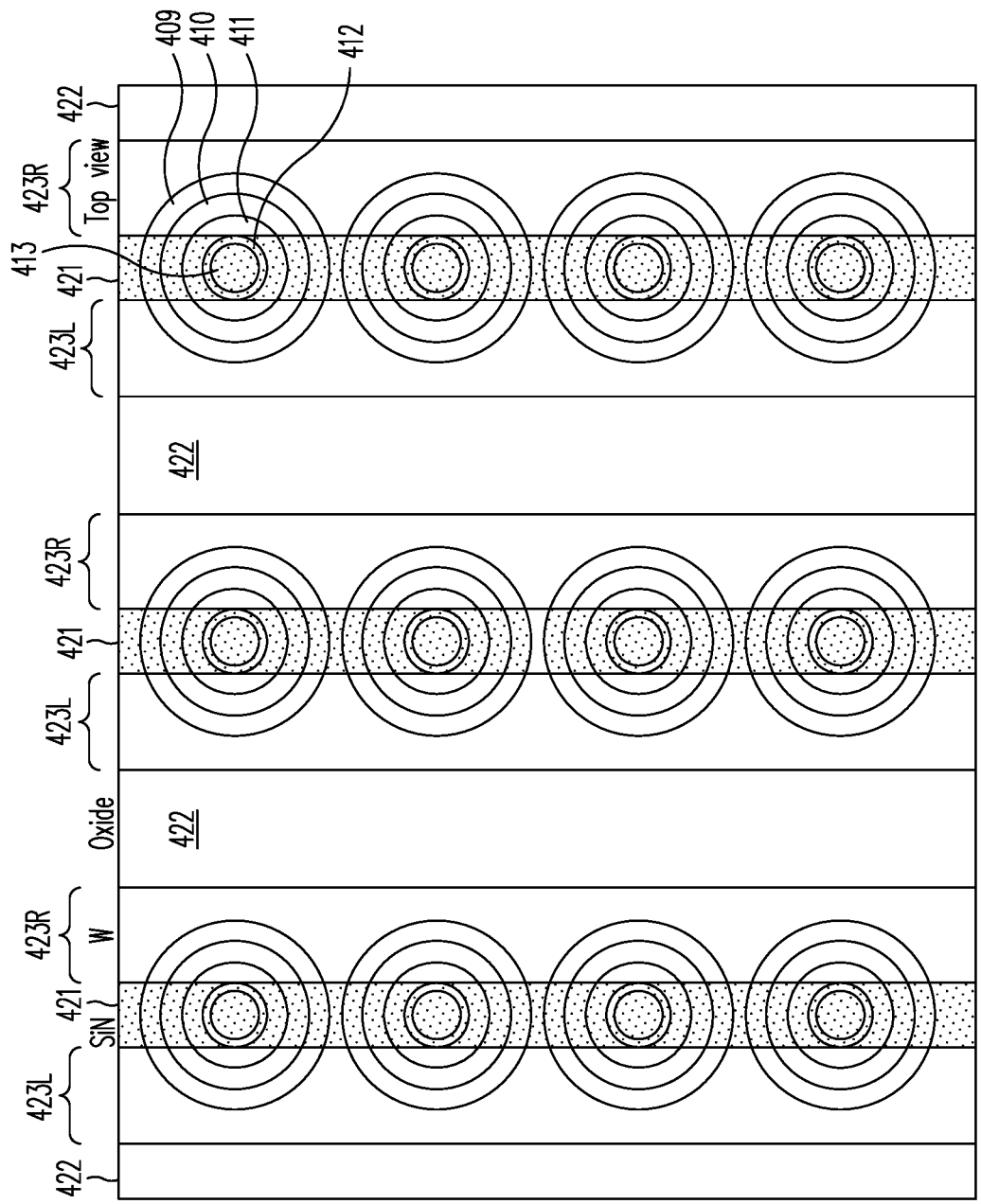
FIG. 4ℓ(iii)

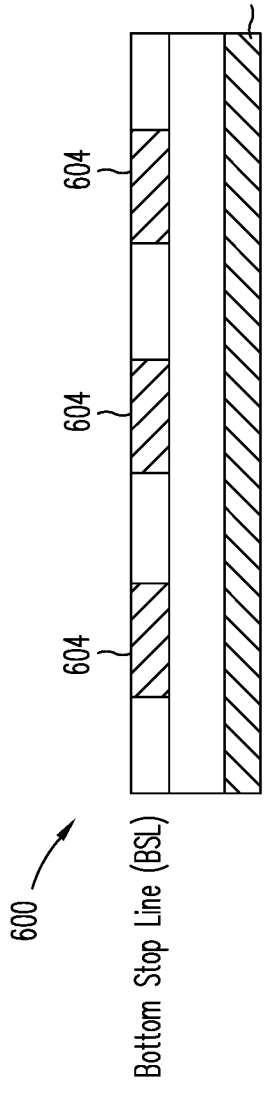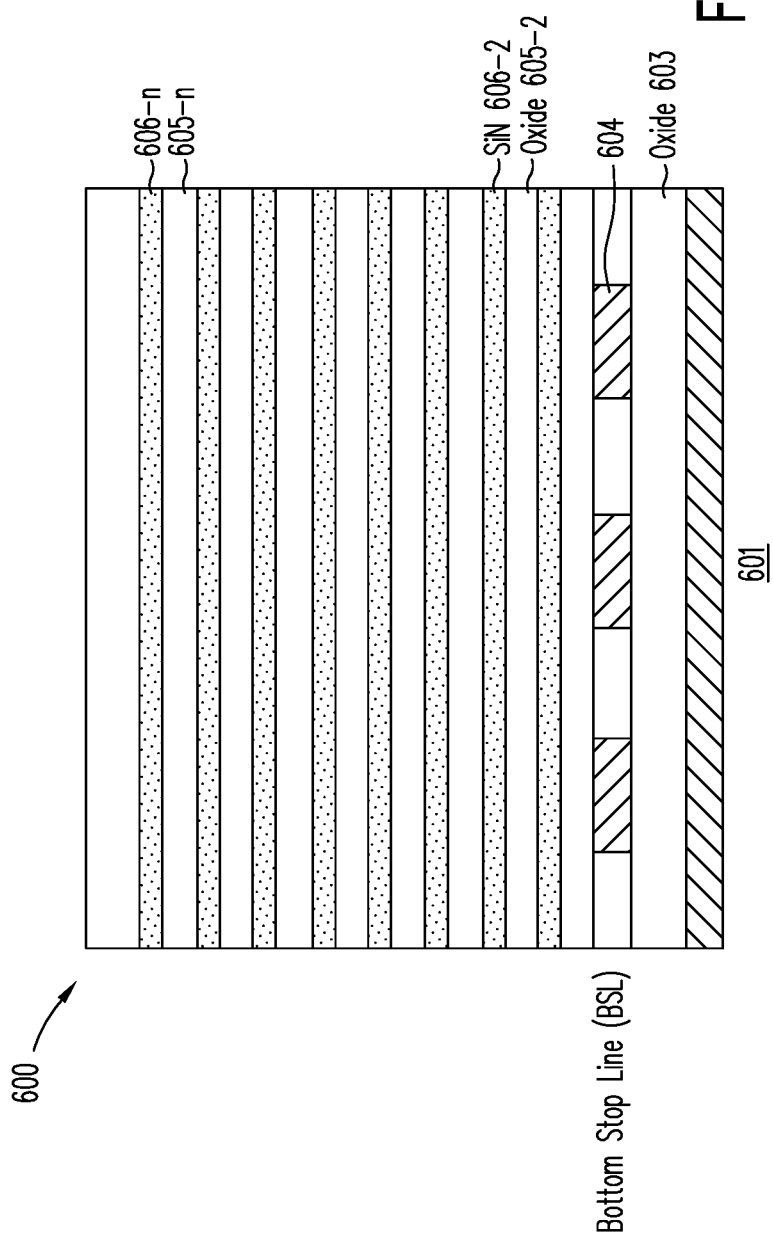

FIG. 6c (ii)

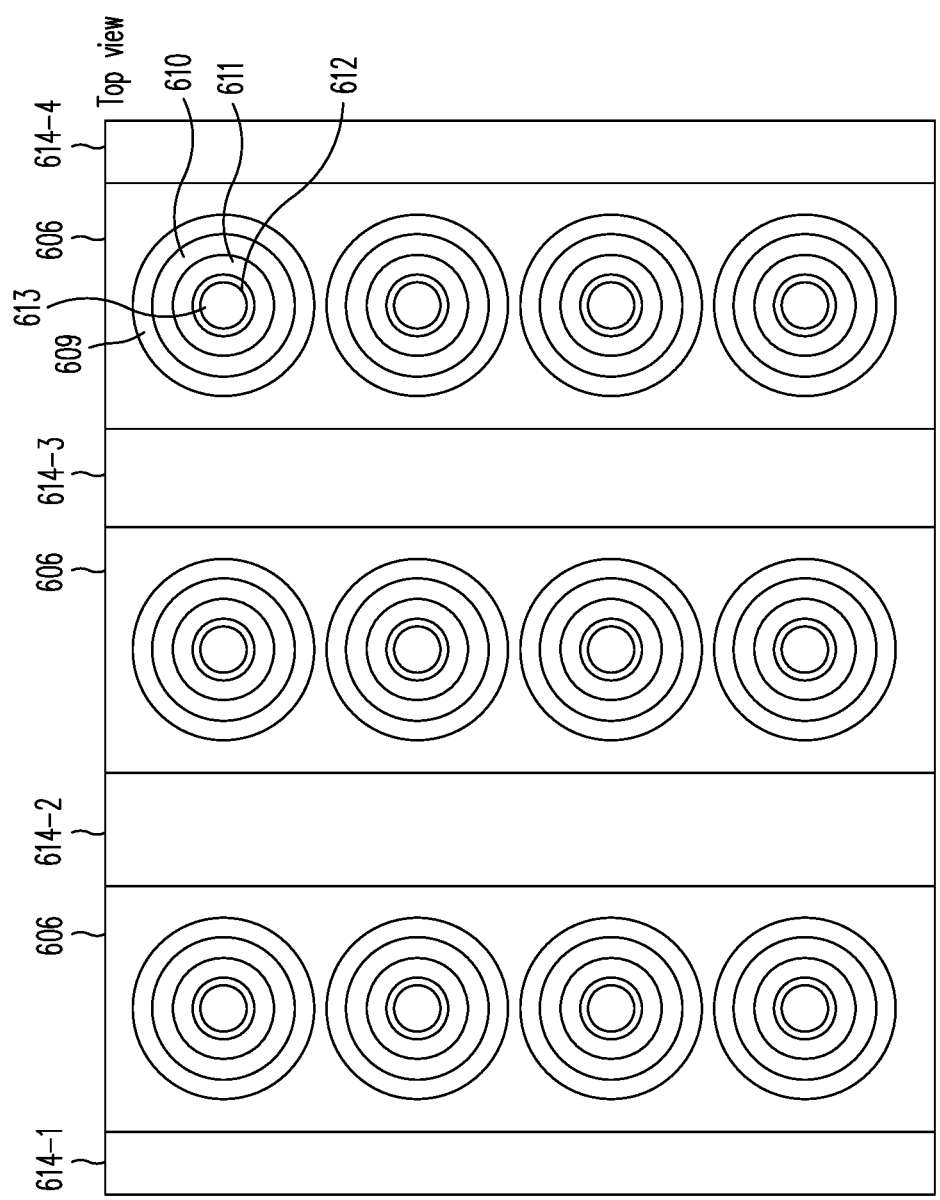
FIG. 6f (ii)

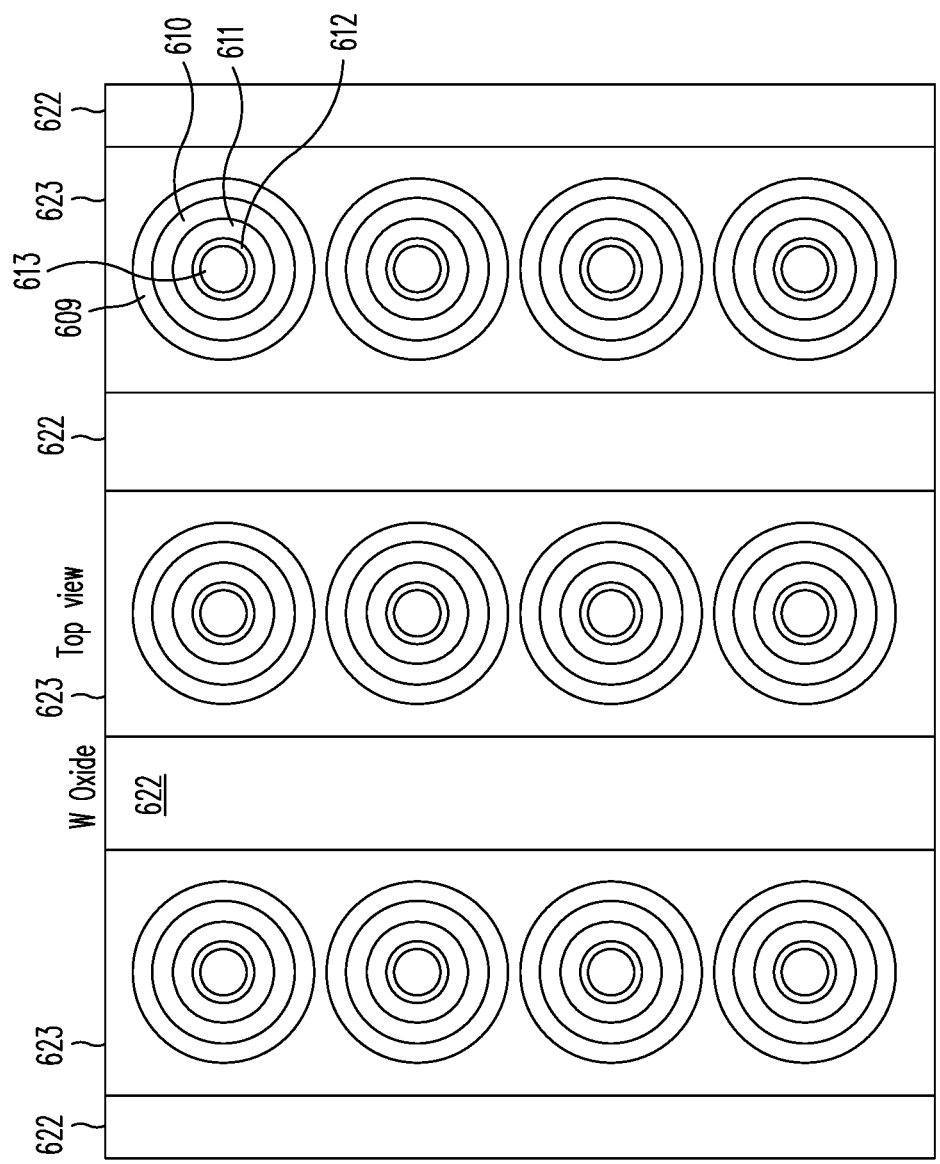
FIG. 6g (ii)

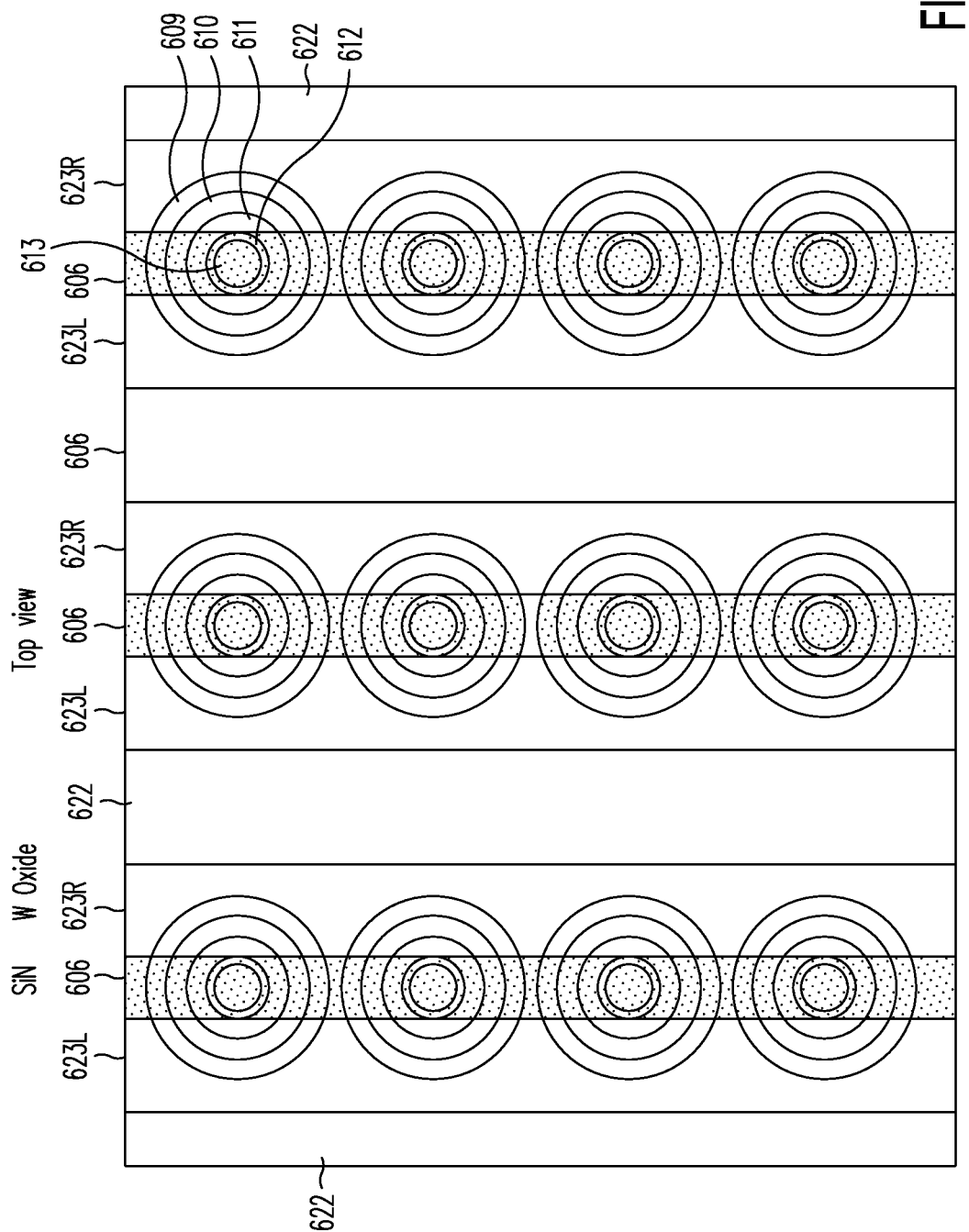
FIG. 6h (iii)

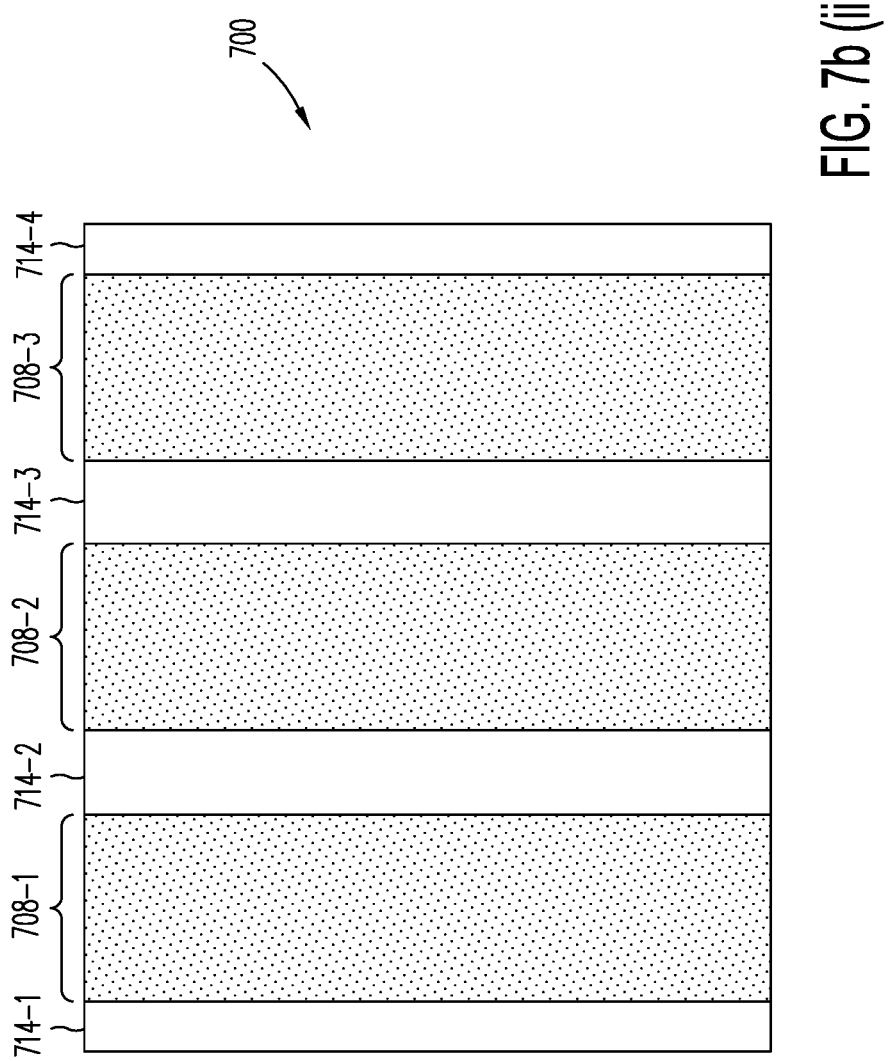
FIG. 7b (ii)

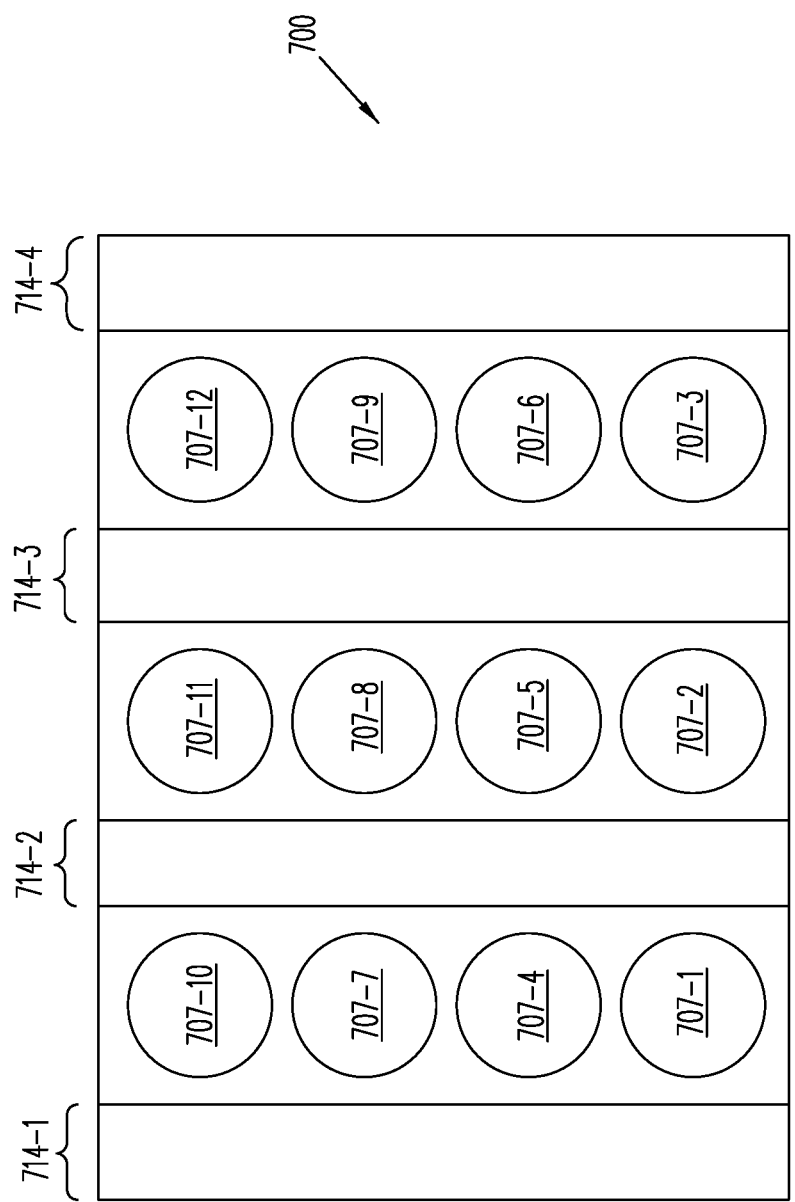
FIG. 7c(ii)

THREE-DIMENSIONAL FERROELECTRIC RANDOM-ACCESS MEMORY (FERAM)

CROSS REFERENCE TO RELATED APPLICATIONS

The present application is related to and claims priority of U.S. provisional patent application ("Provisional Application"), Ser. No. 62/846,418, entitled "3D Ferroelectric Random Access Memory With MLC Capability," filed on May 10, 2019. The disclosure of the Provisional Application is hereby incorporated by reference in its entirety.

BACKGROUND OF THE INVENTION

1. Field of the Invention

The present invention relates to memory circuits. In particular, the present invention relates to high-density, ferroelectric random-access memory arrays including memory cells provided in a 3-dimensional configuration.

2. Discussion of the Related Art

An erase operation in a 3-dimensional non-volatile memory circuits (e.g., NAND-type flash memory circuits) is typically carried out on a block-by-block basis, which involves a long access time. Such memory circuits are not suitable for use in high speed (~50 ns), high density storage class memory (SCM) applications.

Other alternative memory circuits, for example, include:
(i) 3D XPoint memory circuits, jointly developed by Intel Corporation and Micron Corporation, while allowing bit-by-bit access that is suitable for SCM applications, use cross-point patterning (i.e., double exposures for patterning each material layer), which is prohibitively high in manufacturing cost. Also, such 3D XPoint memory circuits are based on a phase-change material (PCM), which results in high leakage currents and, hence, high power dissipation from sneak paths. Selector devices are needed to reduce the leakage currents from sneak paths, which increase the complexity of process and device integration.
(ii) U.S. Pat. Nos. 10,249,370, 10,121,554, 10,121,553, and 9,892,800 disclose 3-dimensional vertical NOR-type memory string arrays, which require complicated X and Y patterning schemes. Due to NOR architecture, the power consumption is also high.

Ferroelectric memory circuits provide yet another alternative. U.S. Pat. No. 6,067,244 to T. Ma, entitled "Erroelectric Dynamic Random Access Memory, filed on Sep. 16, 1998, discloses a ferroelectric field-effect transistor (FeFET) that can serve as a memory circuit, as dipole moments in the FeFET can be aligned in either one of two configurations by an electric field. However, conventional ferroelectric materials, such as those based on lead zirconate titanate (PZT) and strontium bismuth tantalate (SBT), for example, do not provide high-density memory circuits. This is because the ferroelectric layer in an FeFET based on these materials must at least 70 nm thick.

FeFETs based on Hafnium oxide ($HfO_2$) are, however, promising. U.S. patent application publication 2018/0366547A1 ("Liu") discloses various examples of FeFETs. For example, FIGS. 2a and 2b, reproduced respectively from FIG. 4A and FIG. 4B in Liu's disclosure, illustrate the programmed states of exemplary FeFET 1.

As shown in both FIGS. 2a and 2b, FeFET 1 is formed on a $p^-$-type substrate 10 and includes $n^+$-type source and drain regions 101 and 102, respectively, channel region 103, tunneling dielectric layer 13, charge storage region 12 and gate electrode 11. Charge region 12 includes ferroelectric layer 120 and paraelectric layer 121. Paraelectric layer 121 has a "quantum well" energy band structure, which enables a charge-trapping capability suitable for a data storage application. Paraelectric layer 121 may have, for example, alternating layers of a base material and a dielectric material. The base material may be, for example, $Hf_{1-x}Si_xO_2$—x being a value between 0.02 and 0.65, while the dielectric material may be selected from the group consisting of hafnium oxide, zirconium oxide, titanium oxide, titanium nitride, tantalum nitride, aluminum oxide, tantalum oxide and any combination thereof. The alternating layers of base and dielectric materials may be formed using, for example, ALD processes.

Ferroelectric layer 120 may include an alkaline earth metal oxide or a transition metal oxide, such as hafnium oxide, zirconium oxide or hafnium zirconium oxide, with or without a 2-10% dopant selected from the group consisting of silicon, aluminum, yttrium, strontium, gadolinium, lanthanum and any combination thereof. One example of a ferroelectric material is $Hf_{1-x}Si_xO_2$, x ranging between 0.01 and 0.05. The composite material may also include hydrogen atoms in the manufacturing process. Liu discloses that the charge storage region 12 may be 1.0-30.0 nm thick, preferably 5.0-15.0 nm thick.

As shown in FIG. 2a, when a positive bias (e.g., Vt) is applied to gate electrode 11, the electric dipoles in the ferroelectric layer 12 align with the electric field, such that electrons in channel region 103 tunnel through tunnel dielectric layer 13 into and are trapped in paraelectric layer 121. The trapped charge causes positive charge carriers (i.e., holes) to accumulate in channel region 103 ("0" state, which provides a polarization switching voltage for the storage transistor). In this "0" state, FeFET 1 is non-conducting at the read voltage.

As shown in FIG. 2b, when a negative bias (e.g., −Vt) is applied to gate electrode 11, the electric dipoles in charge storage region 12 allow holes in channel region 103 to tunnel to and be trapped in paraelectric layer 121. The trapped charge cause electron accumulation at channel region 103 ("1" state, which provides a negative polarization switching voltage). In this "1" state, FeFET 1 conducting at the read voltage.

Liu also discloses that the ferroelectric layer 120 and paraelectric layer 121 need not be distinct. The ferroelectric layer 120 and paraelectric layer 121 may be provided as a single layer as a blend of the ferroelectric and paraelectric materials.

As disclosure in Liu, a hafnium oxide-based FeFET may be made with a ferroelectric layer that is less than 10 nm thick. Furthermore, such an FeFET may provide a 1-volt threshold-shift window. For example, the article, entitled "Low-Leakage-Current DRAM-Like Memory Using a One-Transistor Ferroelectric MOSFET With a Hf-Based Gate Dielectric" ("Cheng"), by C. Cheng and A. Chin, published in *IEEE Electronic Device Letters*, vol. 35. No. 1, 2014, pp. 138-140, disclose a high-endurance FeFET with a 30 nm thick zirconium-doped $HfO_2$ ferroelectric layer that can be programmed or erase in 5 ns.

FIG. 1a shows an architecture of an AND-type FeFET array that can be laid out in a conventional $4F^2$ configuration. FIG. 1a also provides a table that shows the voltage biases for the word line (WL(m), the source line (SL(m))

and the bit line (BL(m)) of a selected FeFET, as well as the voltage biases for the word line (WL(m+1), the source line (SL(m+1)) and the bit line (BL(m+1)) of a non-selected FeFET, during program, erase and read operations. In Cheng, for example, the programming voltage $V_{pmg}$ and the read voltage $V_{read}$ for such an FeFET may be −4.0 volts and −0.1 volts, respectively.

FIG. 1b shows an architecture of a NOR-type FeFET array. FIG. 1b also provides a table that shows the voltage biases for the word line (WL(m), the source line (SL(m)) and the bit line (BL(m)) of a selected FeFET, as well as the voltage biases for the word line (WL(m+1), the source line (SL(m+1)) and the bit line (BL(m+1)) of a non-selected FeFET, during program, erase and read operations.

SUMMARY

The present invention provides a 3-dimensional vertical memory string array that includes high-speed ferroelectric field-effect transistor (FET) cells that are low-cost, low-power, or high-density and suitable for SCM applications. The memory circuits of the present invention provide random-access capabilities.

According to one embodiment of the present invention, a memory string formed above a planar surface of substrate includes: (a) a vertical gate electrode (e.g., tungsten or a heavily doped semiconductor) extending lengthwise along a vertical direction relative to the planar surface, (b) a ferroelectric layer provided over at least a portion of the gate electrode along a horizontal direction substantially parallel the planar surface and extending lengthwise along the vertical direction; (c) a gate oxide layer provided over at least a portion of the ferroelectric layer along the horizontal direction and extending lengthwise along the vertical direction; (d) a channel layer provided over at least a portion of the gate oxide layer along the horizontal direction and extending lengthwise along the vertical direction; and conductive semiconductor regions embedded in and isolated from each other by an oxide layer arrayed along the horizontal direction, wherein the gate electrode, the ferroelectric layer, the channel layer, the gate oxide layer and each adjacent pair of semiconductor regions from a storage transistor of the memory string, and wherein the adjacent pair of semiconductor regions serve as source and drain regions of the storage transistor. In addition, a barrier layer (e.g., titanium nitride, tungsten nitride or tantalum nitride) may be provided between the gate electrode and the ferroelectric layer. The drain or source region may also be provided drain or source electrodes (e.g., tungsten or n+ polysilicon).

The memory strings of the present invention may be organized into a memory array, and a staircase configuration provides electrical contacts to each of the source or drain electrodes. Storage transistors may be provided on opposite sides of each memory hole in which the gate, the ferroelectric layer, the gate oxide layer and the channel silicon layer are provided. One or more networks of global word line conductors each connecting the gate electrodes of a selected group of the memory strings may be provided above the memory array, below the memory array or both.

The ferroelectric layer comprises a zirconium-doped or silicon-doped HfO$_2$ ferroelectric material. The zirconium-doped hafnium silicon oxide may have a zirconium content of 40-60%, preferably 45-55%. The silicon-doped hafnium silicon oxide may have a silicon content of 2.0-5.0%, preferably 2.5-4.5%. The hafnium silicon oxide is prepared by depositing HfO$_2$ and SiO$_2$ or ZrO$_2$ using an ALD layer-by-layer lamination step.

In one embodiment the memory string further includes a charge-trapping layer that is between the gate oxide layer and the ferroelectric layer or between the ferroelectric layer and the barrier layer.

Various manufacturing processes, some of which are illustrated herein, may be used to fabricate a memory array of the memory strings of the present invention.

The present invention is better understood upon consideration of the detailed description below in conjunction with the accompanying drawings.

BRIEF DESCRIPTION OF THE DRAWINGS

FIG. 3a shows, in particular, vertical 3-D FeFET strings 300a, 300b and 300c, according to one embodiment of the present invention.

FIGS. 6a-6j illustrate an exemplary fabrication process for memory array 600, in accordance with one embodiment of the present invention.

Figure 1A:
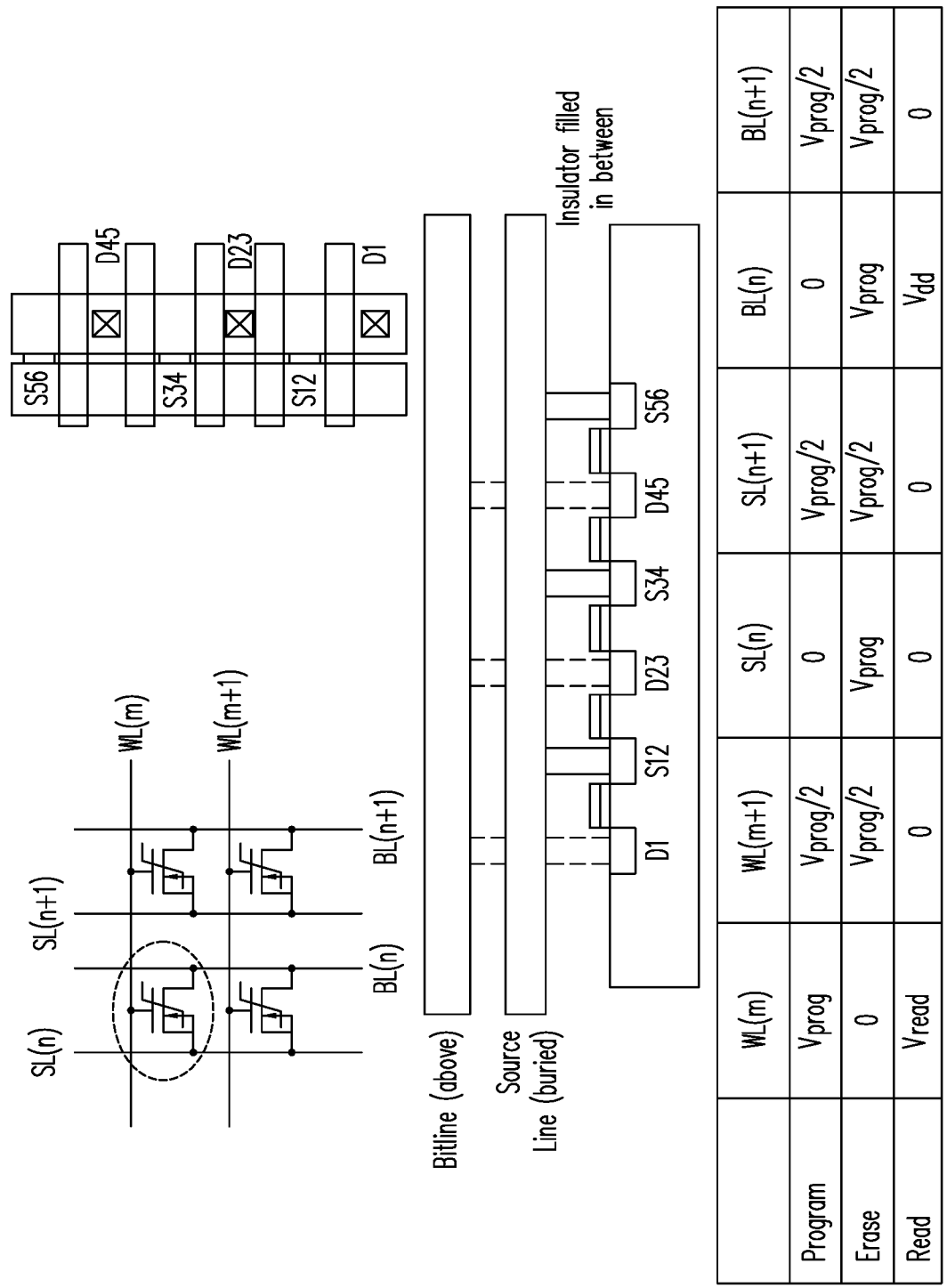
FIG. 1a shows an architecture of an AND-type FeFET array that can be laid out in a conventional 4F$^2$ configuration.
Figure 1B:
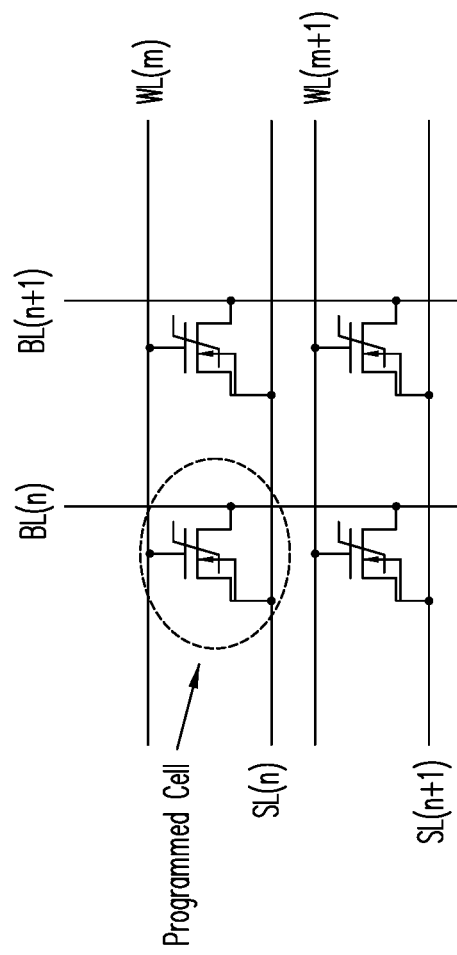
FIG. 1b shows an architecture of a NOR-type FeFET array.
Figure 2A:
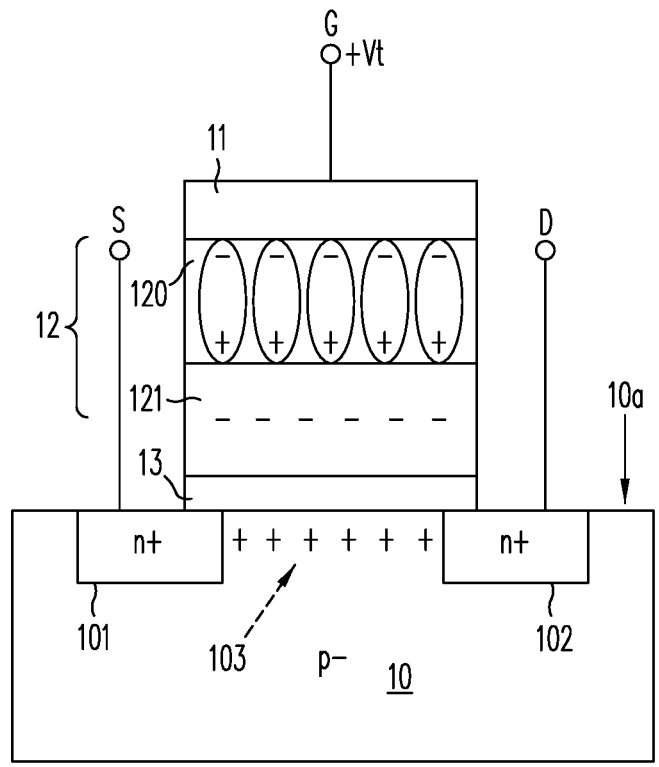
FIGS. 2a and 2b, reproduced from FIGS. 4A and 4B of U.S. patent application publication 2018/0366547A1 ("Liu"), illustrate the programmed states of exemplary FeFET 1.
Figure 2B:
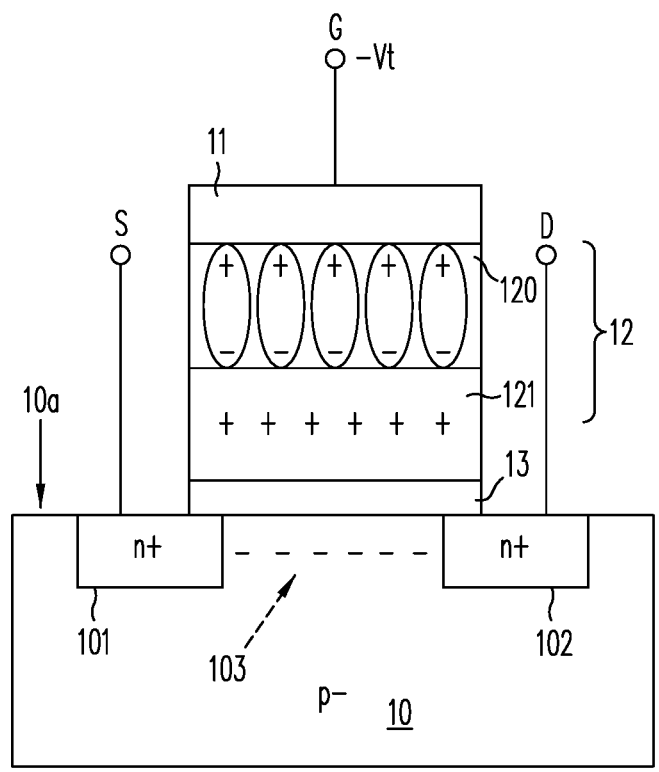

To facilitate cross-referencing among the figures, like elements are assigned like reference numerals. The figures may depict 3-dimensional objects from different perspectives. To facilitate description of 3-dimensional objects, a cartesian coordinate system is provided, with X- and Y-directions denoting orthogonal horizontal directions and the Z-direction denoting the vertical direction. As this detailed description refers to structures fabricated on a planar surface of a substrate, "vertical" is understood to refer to the direction substantially perpendicular to the planar surface and "horizontal" is understood to refer to directions substantially parallel to the planar surface.

DETAILED DESCRIPTION OF THE PREFERRED EMBODIMENTS

The present invention may be carried out by, for example, a vertical metal-ferroelectric-insulator semiconductor (MFIS) transistor that includes (a) tungsten/titanium nitride or $n^+$ polysilicon/titanium nitride gate electrode, (ii) zirconium-doped or silicon-doped $HfO_2$ ferroelectric layer, (iii) a gate oxide layer, (iv) a p-type channel region, (v) an n-type source region, and (v) an n-type drain region.

In such an MFIS transistor, the $n^+$ polysilicon may be arsenic-doped polysilicon with dopant concentration of $5.0 \times 10^{21}$ to $1.0 \times 10^{22}$ $cm^{-3}$. The $HfO_2$ ferroelectric layer may be 5.0-15.0 nm thick, preferably 8.0-12.0 nm thick, deposited by atomic layer deposition (ALD). If doped by zirconium, the ferroelectric layer should have zirconium content of 40-60%, preferably 45-55%. If doped by silicon, the ferroelectric layer should have silicon content of 2.0-5.0%, preferably 2.5-4.5%. The gate oxide layer may be, for example, 1.0-3.0 nm thick silicon oxide ($SiO_2$) or silicon oxynitride (SiON). The p-type channel region may be, for example, intrinsic polysilicon or boron-doped polysilicon with a dopant concentration of $1.0 \times 10^{16}$ to $1.0 \times 10^{18}$ $cm^{-3}$, deposited by chemical vapor deposition (CVD), using any of boron, diborane ($H_2B_2$), and trimethyl borane ($B(CH_3)_3$ gases, or any of their combinations). The n-type drain and source regions may each be, for example, phosphorus-doped or arsenic-doped polysilicon with a dopant concentration of $1.0 \times 10^{20}$ to $1.0 \times 10^{22}$ $cm^{-3}$, deposited by CVD, using phosphine ($PH_3$) or phosphorus trichloride ($PCl_3$), if phosphorus-doped, and arsenic or arsenic hydride ($AsH_3$), if arsenic-doped.

Si-doped $Hf_{1-x}Si_xO_y$ ferroelectric thin-film may be formed by depositing $HfO_2$ and $SiO_2$ using ALD layer-by-layer lamination, which allows the values of x and y be adjusted by the individual cycle numbers of $HfO_2$ and $SiO_2$. For example, x may range from 0.02 to 0.05, preferably between 0.025 and 0.04, and y may range from 1.8 to 2.2, preferably between 1.9 and 2.1. A suitable $Hf_{1-x}Si_xO_y$ ferroelectric thin-film may be, for example, between 5.0-15.0 nm thick, preferably between 8.0-12.0 nm thick for FeFET memory applications. $HfO_2$ may be prepared from any of the following precursors: tetrakis(ethylmethylamino) hafnium (TEMAH), tetrakis(dimethylamino) hafnium (TDMAH) and hafnium tetrachloride ($HfCl_4$), using as oxidant $O_3$ or $H_2O$, at a deposition temperature between 150-400° C. Similarly, SiO2 can be prepared from any of the following precursors: tetrakis(dimethylamino) silane (4DMAS), tris (dimethylamino) silane (3DMAS), tetrakis(ethylmethylamino) silane (TEMA-Si) and silicon tetrachloride ($SiCl_4$), using as oxidant $O_3$ or $H_2O$, at a deposition temperature between 150-400° C.

Zr-doped $Hf_xZr_{1-x}O_y$ ferroelectric thin-films may be formed by depositing $HfO_2$ and $ZrO_2$ using ALD layer-by-layer lamination, which allows the values of x and y be adjusted by the individual cycle numbers of $HfO_2$ and $ZrO_2$. For example, x may range between 0.4 and 0.6, preferably between 0.45 and 0.55, and y may range between 1.8 and 2.2, preferably between 1.9 to 2.1. A suitable $Hf_xZr_{1-x}O_y$ ferroelectric thin-film may be 5.0-15.0 nm thick, preferably 8.0-12.0 nm thick for FeFET memory applications. $HfO_2$ may be prepared from any of the following precursors: tetrakis(ethylmethylamino) hafnium (TEMAH), tetrakis(dimethylamino) hafnium (TDMAH), and hafnium tetrachloride ($HfCl_4$), using as oxidant $O_3$ or $H_2O$, at a deposition temperature of 150-400° C. $ZrO_2$ may be prepared from any of the following precursors: tetrakis(ethylmethylamino) zirconium (TEMAZ), tetrakis(dimethylamino) zirconium (TDMAZ) and zirconium tetrachloride ($ZrCl_4$), using as oxidant $O_3$ or $H_2O$, at a deposition temperature between 150-400° C.

Figure 3A:
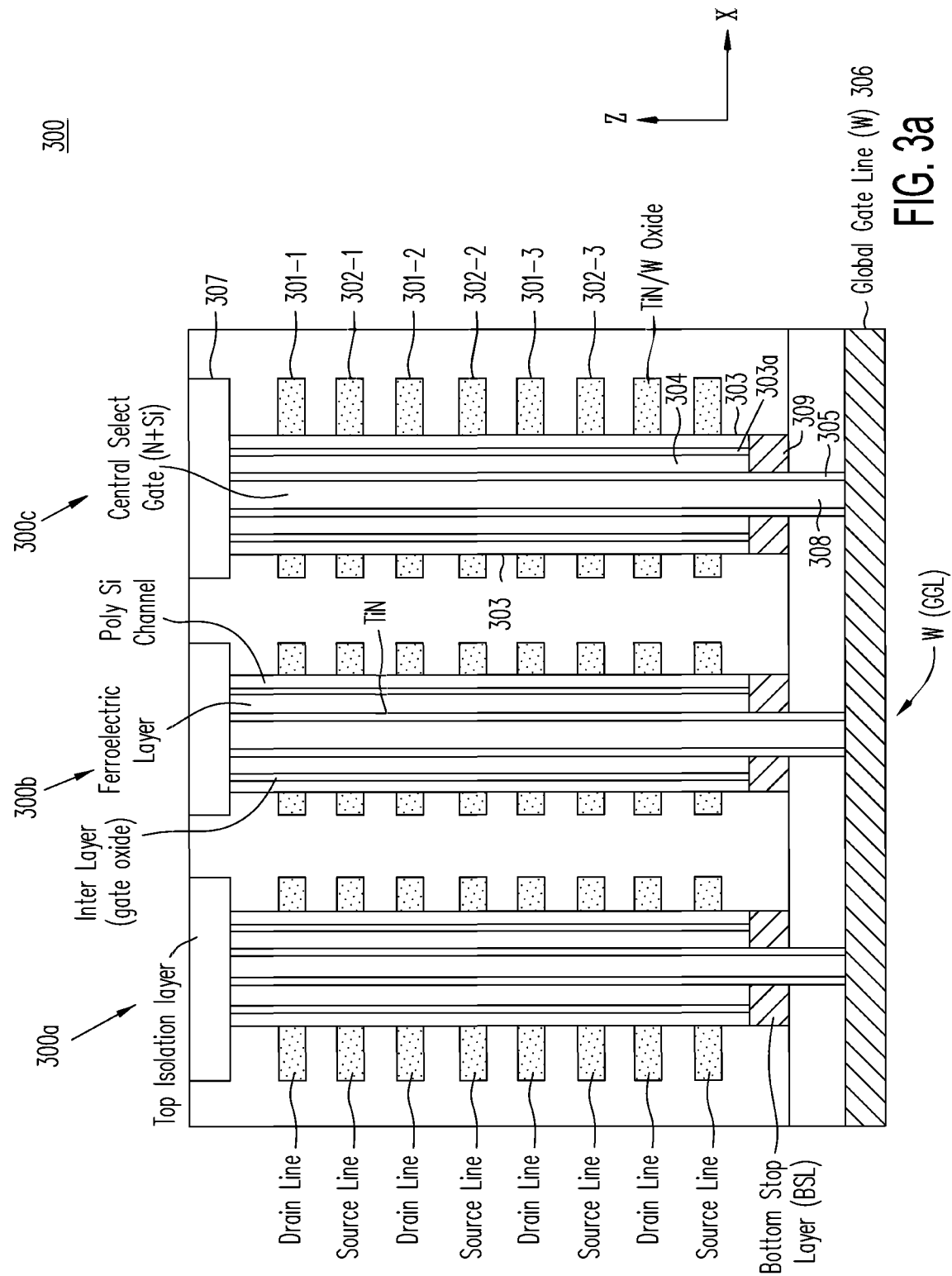
FIG. 3a shows a vertical section of memory array 300, which includes a regular arrangement of vertical 3-dimensional (3-D) FeFET strings.

FIG. 3a shows a vertical section in the X-Z plane of memory array 300, which includes a regular arrangement of vertical 3-dimensional (3-D) FeFET strings; FIG. 3a shows, in particular, vertical 3-D FeFET strings 300a, 300b and 300c, according to one embodiment of the present invention. FIG. 3a shows three vertical 3-D FeFET strings merely for the purpose of illustration; memory array 300 may include many more than vertical 3-D FeFET strings arranged along each of the X- and Y-directions.

As shown in FIG. 3a, each vertical 3-D FeFET string includes (i) multiple annular drain electrodes 301-1, 301-2, . . . , and 301-n, (ii) multiple annular source electrodes 302-1, 302-2, . . . , and 302-n, (iii) annular channel polysilicon region 303, (iv) gate or tunnel oxide layer 303a, and (v) annular ferroelectric layer 304, surrounding common gate electrode 308. Common gate electrode 308 may have a conductor core (e.g., tungsten or heavily doped n-type polysilicon) with an outer adhesion layer or barrier layer (e.g., titanium nitride) 305. Each vertical 3-D FeFET string is electrically isolated by top and bottom isolation layers 307 and 309.

Each drain or source electrode may be provided, for example, by n-type polysilicon, titanium nitride, tungsten or any combination of these materials. Channel polysilicon region may be provided, for example, by p-type polysilicon. Ferroelectric layer 304 may be provided by, zirconium-doped or silicon-doped $HfO_2$ ferroelectric material. Common gate electrode may be provided, for example, by tungsten/titanium nitride or $n^+$ polysilicon/titanium nitride. Gate oxide layer 303a may be provided, for example, $SiO_2$ or SiON.

In each vertical 3-D FeFET string, each memory cell is an MFIS transistor formed by an adjacent pair of drain and source electrodes (e.g., drain electrode 301-1 and source electrode 302-1), and the portions of channel polysilicon region 303, gate or tunnel oxide layer 303a, annular ferroelectric-paraelectric layer 304, and common gate electrode 308 between the adjacent drain and source electrodes. FIG. 3a also shows that the gate electrodes of vertical 3-D FeFET strings 300a, 300b and 300c are electrically connected by conductive global word line 306. In memory array 300, (i) the common gate electrodes in a row of vertical 3-D FeFET strings along the X-direction are electrically connected; (ii) drain electrodes at the same vertical level of the vertical 3-D FeFET strings in a row along the Y-direction are electrically connected; and source electrodes at the same vertical level of the vertical 3-D FeFET strings in a row along the Y-direction are electrically connected.

Figure 3B:
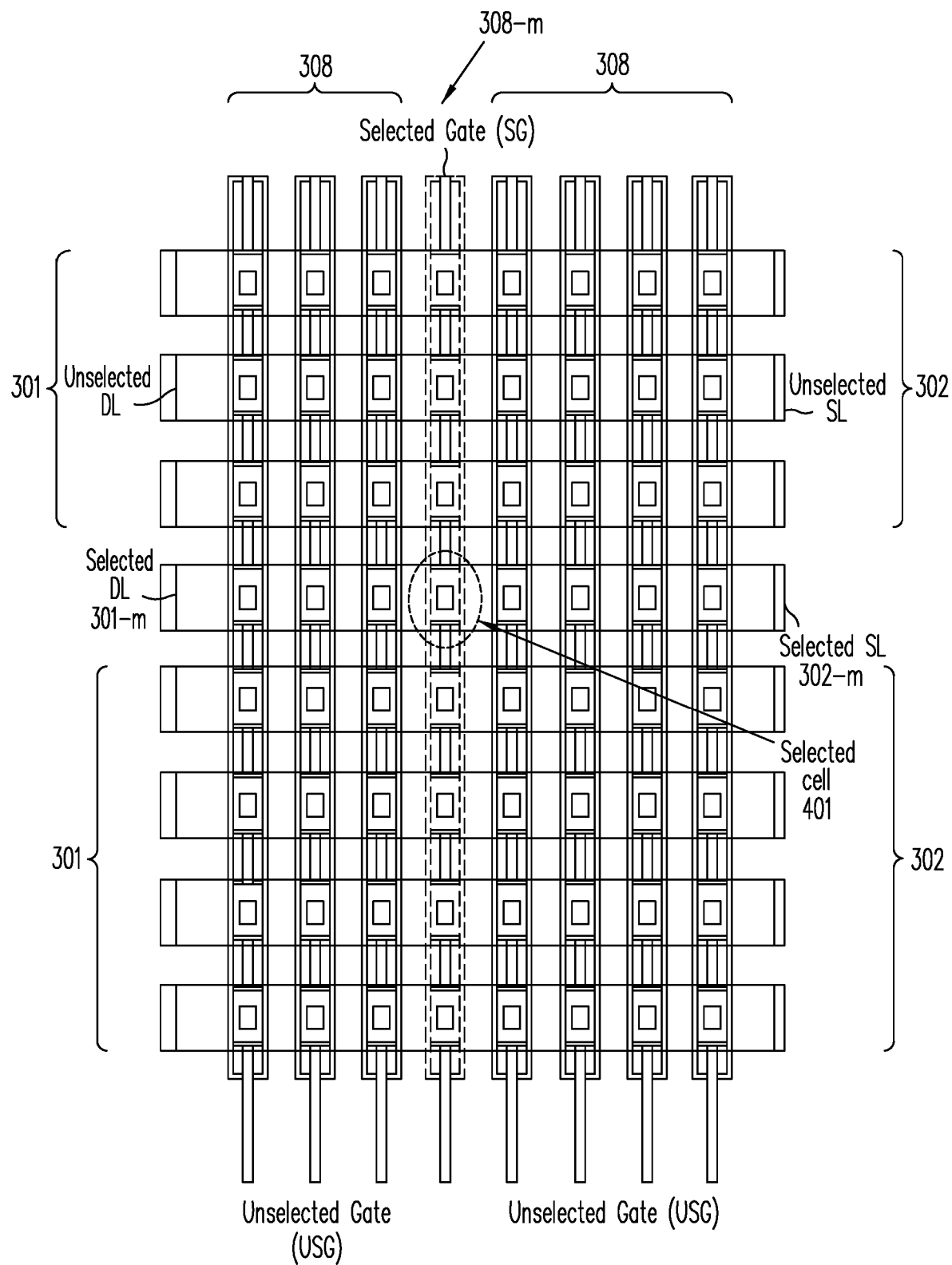
FIG. 3b shows an Y-Z plane cross section of memory array 300, showing the gate, drain and source connectivities of eight vertical 3-D FeFET strings, according to one embodiment of the present invention.

FIG. 3b shows an Y-Z plane cross section of memory array 300, showing the gate, drain and source connectivities of eight vertical 3-D FeFET strings, according to one embodiment of the present invention. Again, FIG. 3b shows eight vertical 3-D FeFET strings merely for the purpose of illustration. In any embodiment, memory array 300 may include more than eight vertical 3-D FeFET strings arranged along each of the X- and Y-directions. FIG. 3b illustrate selection of MFIS transistor or cell 401 by applying selection voltage biases on associated gate electrode 308-m, drain electrode 301-m and source electrode 302-m. There are three types of non-selected MFIS transistors: (a) "selected gate, non-selected drain or source" MFIS transistors—those sharing selected gate electrode 308-m, but are associated with one of non-selected drain electrodes 301 and one of the non-selected source electrodes 302; (b) "non-selected gate, selected drain or source" MFIS transistors—those MFIS transistors associated with one of the non-selected gate electrodes 308, but associated with selected drain electrode 301-m and selected source electrode 302-m; and (c) "non-selected gate, non-selected drain or source" MFIS transistors—those MFIS transistors associated with neither selected gate electrode 308-*m*, nor with selected drain electrode 301-*m* and selected source electrode 302-*m*. In a reading, programming, or erase operation, different voltage biases are required for a selected MFIS transistor and each of the three types of non-selected MFIS transistors.

FIGS. 4*a*-4*l* illustrate an exemplary fabrication process for memory array 400, in accordance with one embodiment of the present invention. As shown in vertical section in FIG. 4*a*, a network of conductors ("global gate lines"), including global gate line 402, are formed over semiconductor substrate 401, which may be a semiconductor wafer. The global gate lines may be formed out of tungsten, isolated from each other and from semiconductor substrate 401 by an isolation layer (e.g., silicon oxide).

Figure 4A:
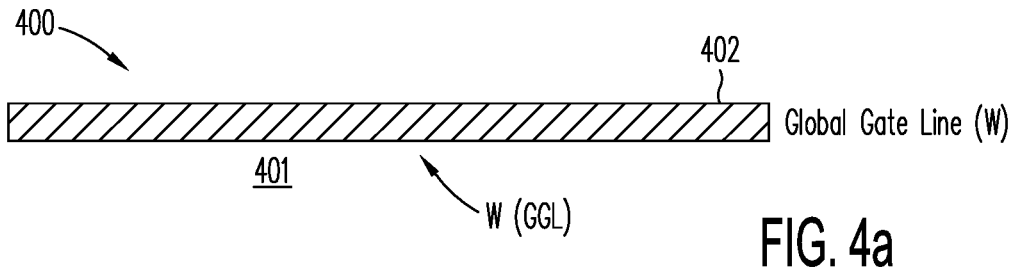
FIGS. 4a-4l illustrate an exemplary fabrication process for memory array 400, in accordance with one embodiment of the present invention.
Figure 4B:
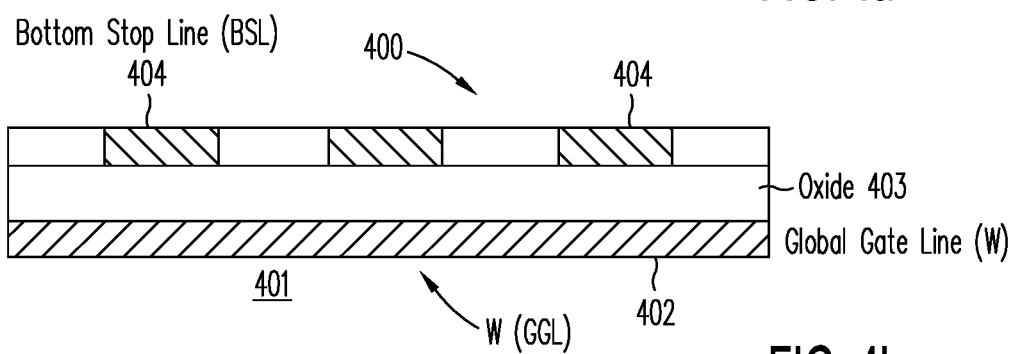
Figure 4C:
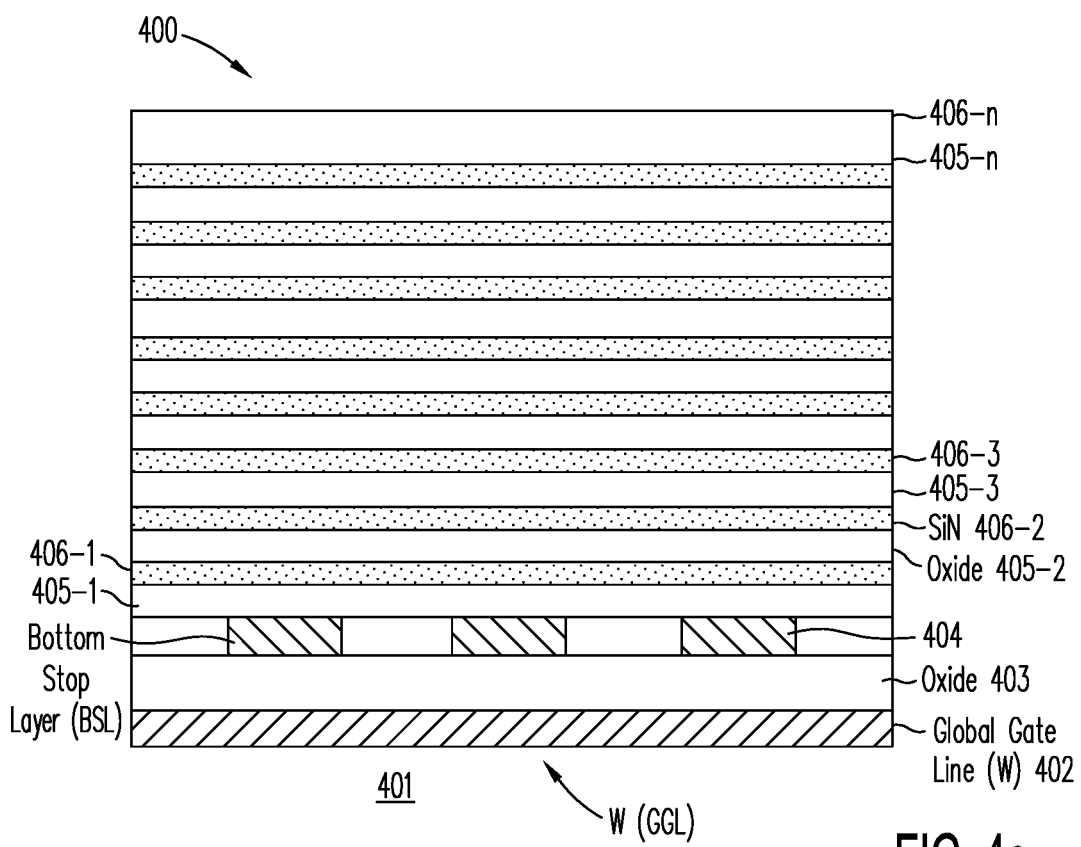

Thereafter, as shown in vertical section FIG. 4*b*, oxide layer 403 (e.g., silicon oxide) and bottom etch stop layer 404 (e.g., n$^+$ polysilicon) are deposited over the global gate lines. Etch stop layer 404 may be patterned, as shown, and embedded in oxide layer 403. Then, as shown in vertical section in FIG. 4*c*, alternating layers of silicon oxide layers 405 and silicon nitride layers 406 are deposited, numbered herein as silicon oxide layers 405-1, . . . , and 405-*n*, and silicon nitride layers 406-1, . . . , 406-*n*, respectively.

Figure 4D:
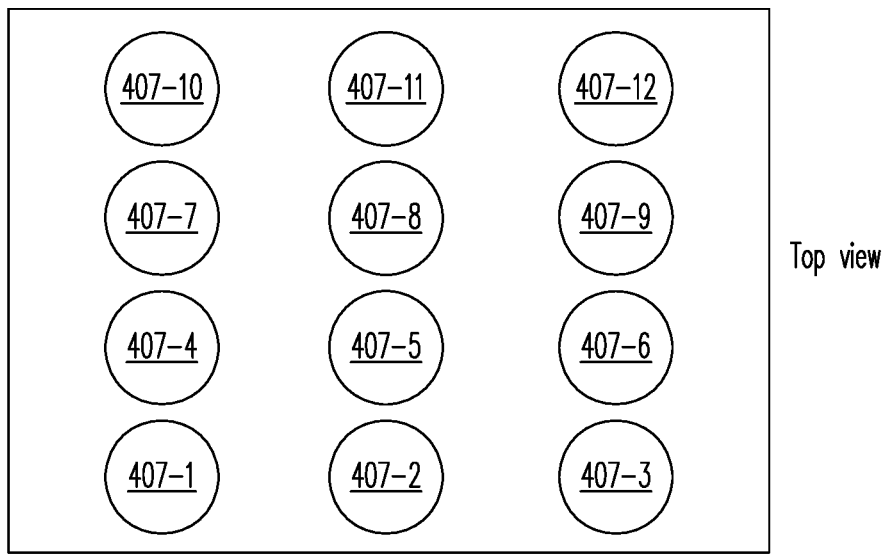
Figure 4D:
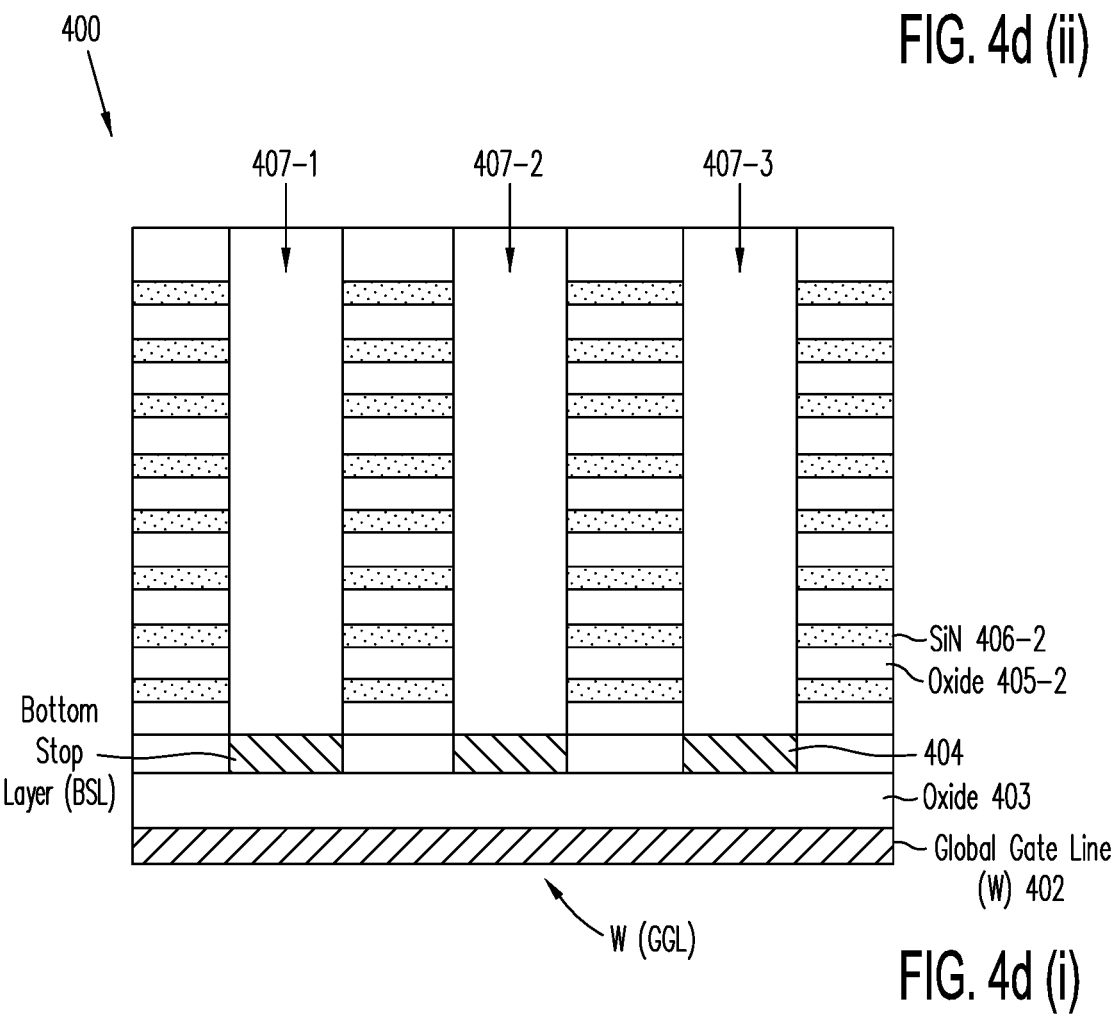
Figure 4E:
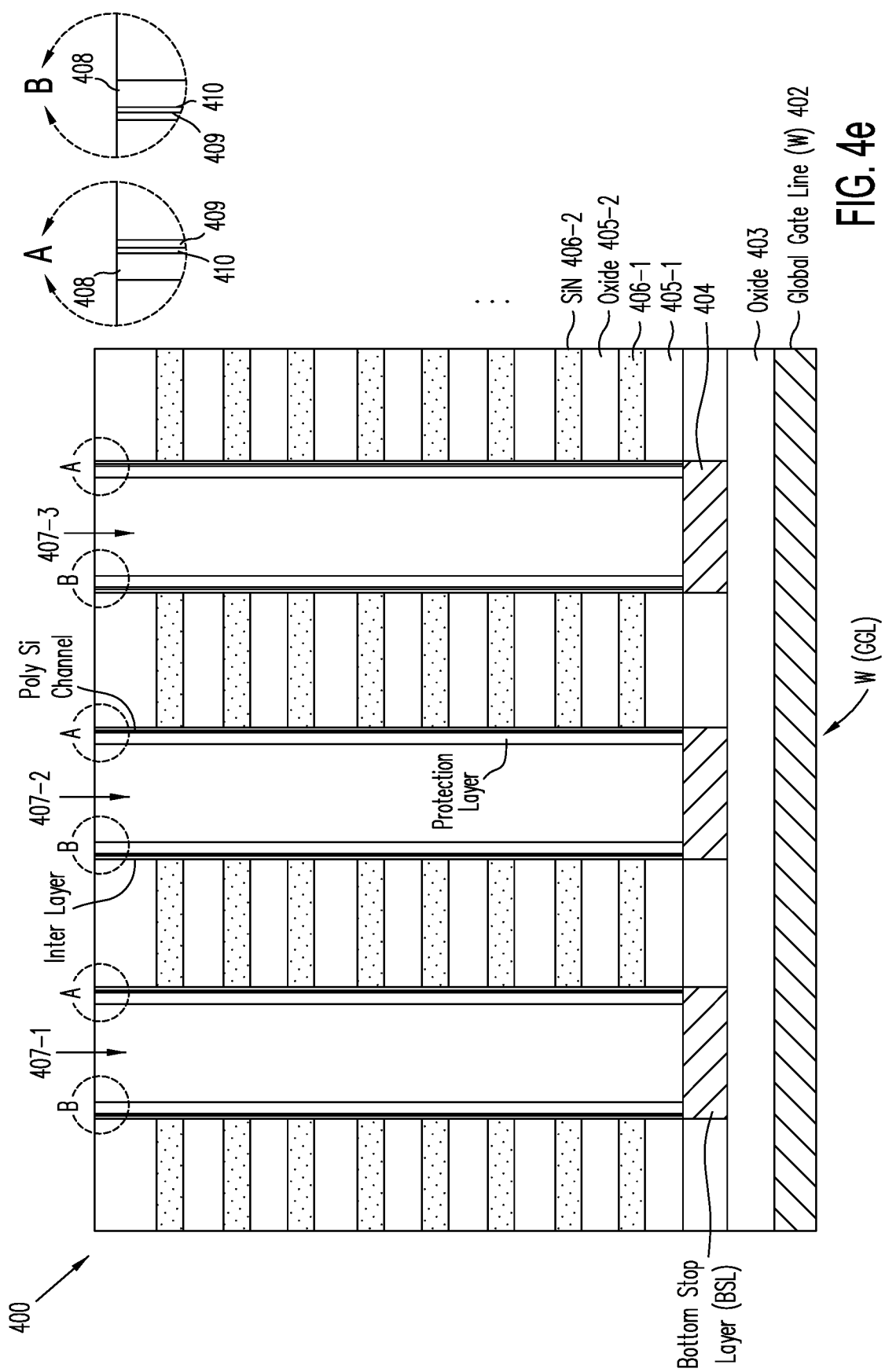

An array of shafts ("memory holes") 407 (e.g., memory holes 407-1, 407-2 and 407-3) are then etched through the alternating layers of silicon oxide layers 405 and silicon nitride layers 406 down to etch stop layer 404, as shown in vertical section in FIG. 4*d*(i). FIG. 4*d*(ii) shows in horizontal cross section through one of silicon nitride layers 406, showing memory holes 407-1 to 407-9 of memory array 400 at this step of formation.

Polysilicon layer 409 is then conformally deposited, followed by deposition of thin gate oxide layer 410. Polysilicon 409 may be deposited as amorphous silicon and annealed at 850° C. for 2 hours to crystallize. Protective layer 408 may then be deposited over gate oxide layer 410. A spacer etch is then carried out to remove any deposited polysilicon and gate oxide from the bottom of memory holes 407. Chemical mechanical polishing (CMP) step may be carried out to remove materials of protective layer 408, gate oxide 410, and polysilicon layer 409 from the top of the structure. The resulting structure (i.e., memory array 400 at this step of formation) is shown in vertical section in FIG. 4*e*.

Figure 4F:
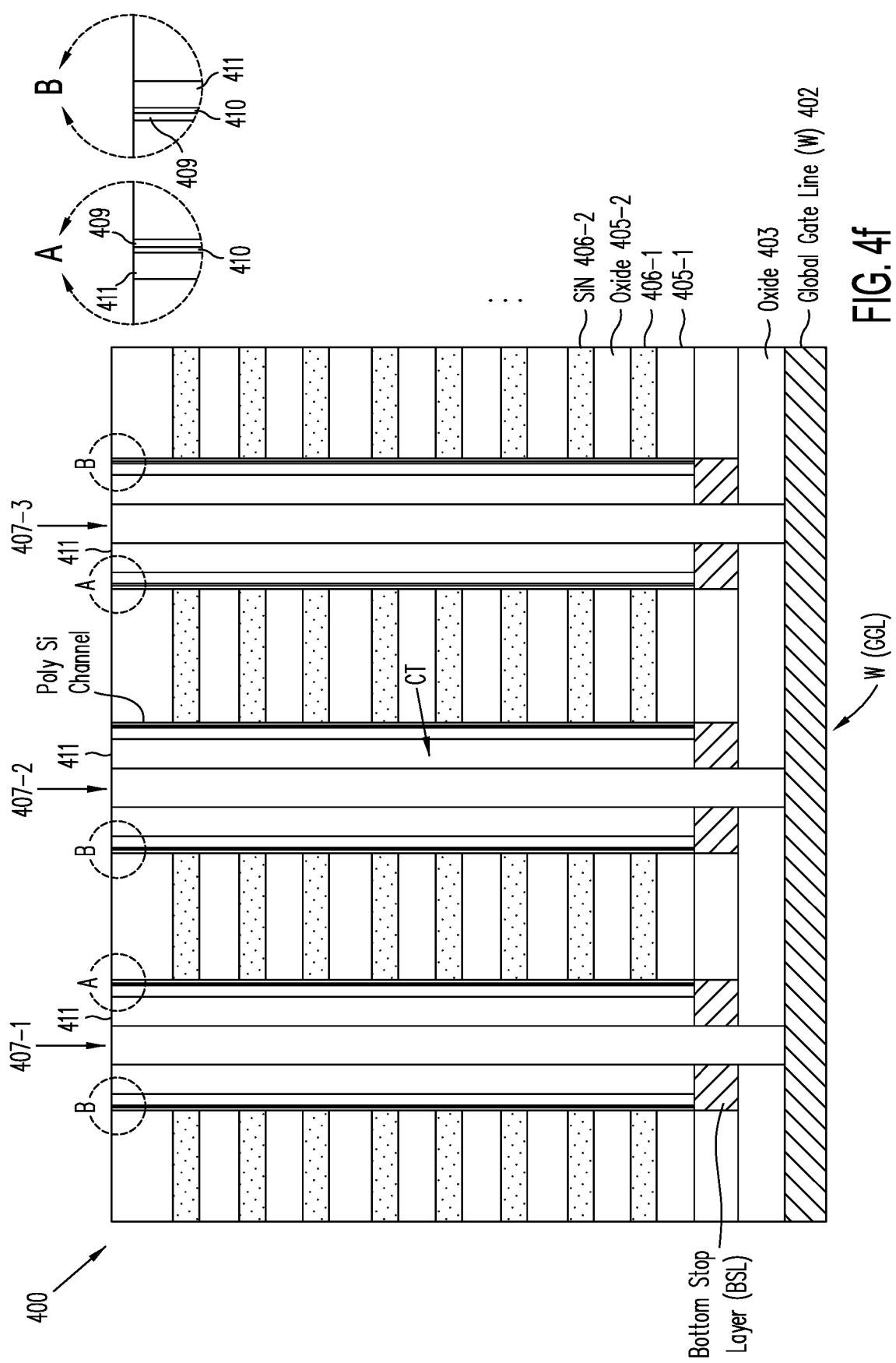

Protective layer 408 is then removed. Ferroelectric layer 411 (e.g., a Si-doped or Zr-doped $Hf_{1-x}Si_xO_y$, $Hf_xZr_{1-x}O_y$ ferroelectric thin-film) is then deposited. CMP and a bottom etch step removes excess ferroelectric material from the top of the structure and the bottom of memory holes 407. The portion of etch stop layer 404 exposed at the bottom of memory holes 407 is then removed. An oxide etch then creates vias that expose the global gate lines (e.g., global gate line 402) underlying memory holes 407. The resulting structure (vertical section) is shown in FIG. 4*f*.

Figure 4G:
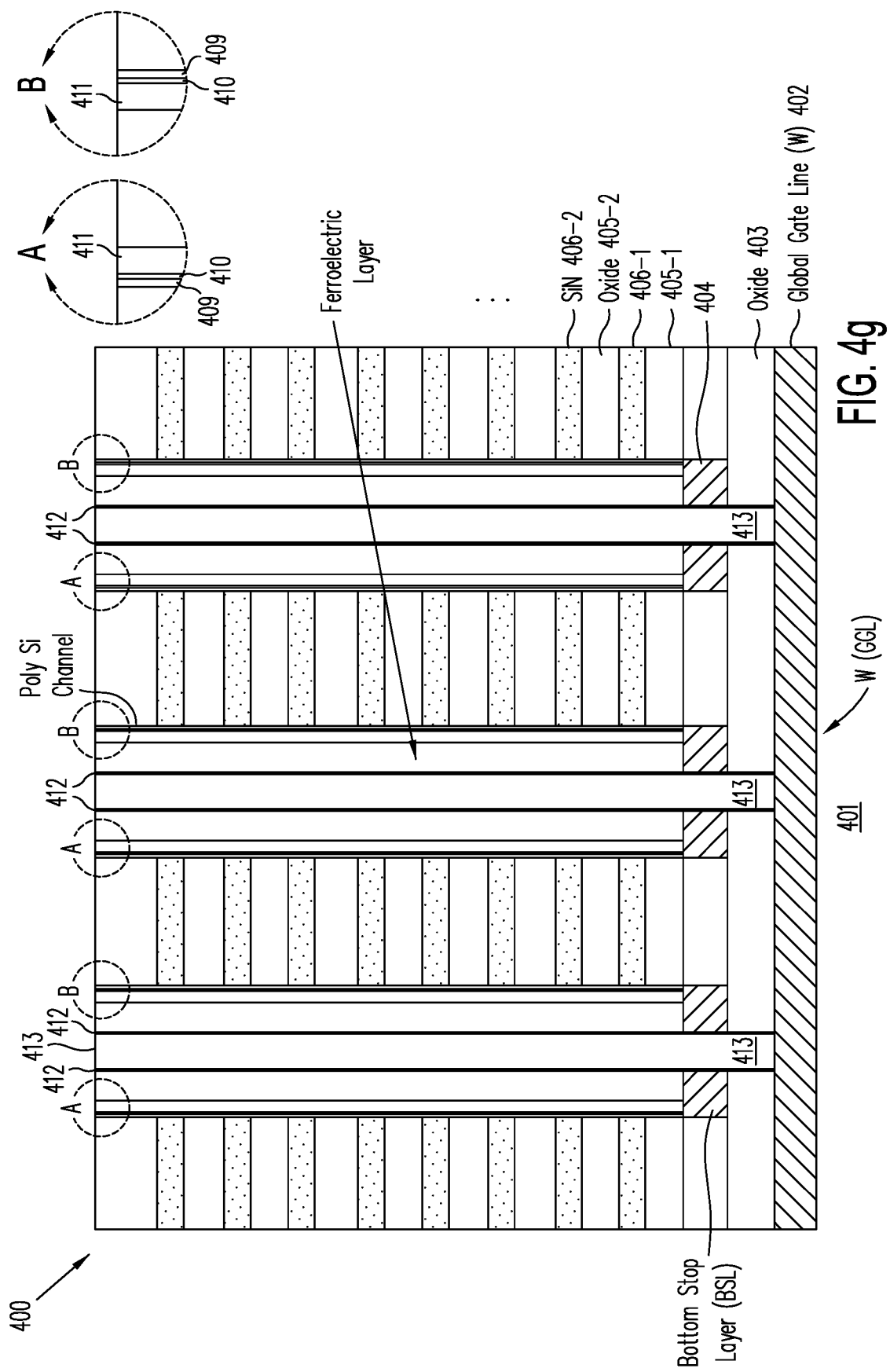

An adhesion/barrier layer of titanium nitride (TiN) 412 is then conformally deposited. An etch step then removes the TiN material from the portion of memory holes 407. Other barrier layers (e.g., tungsten nitride or tantalum nitride) may also be used. Memory holes 407 are then filled with gate electrode material 413, which may be a chemical vapor deposited tungsten ("CVD W") or an n$^+$ polysilicon (i.e., a heavily doped n-type polysilicon). Excess deposited material is then removed by CMP from the top of the structure. The resulting structure (vertical section) is shown in FIG. 4*g*.

Figure 4H:
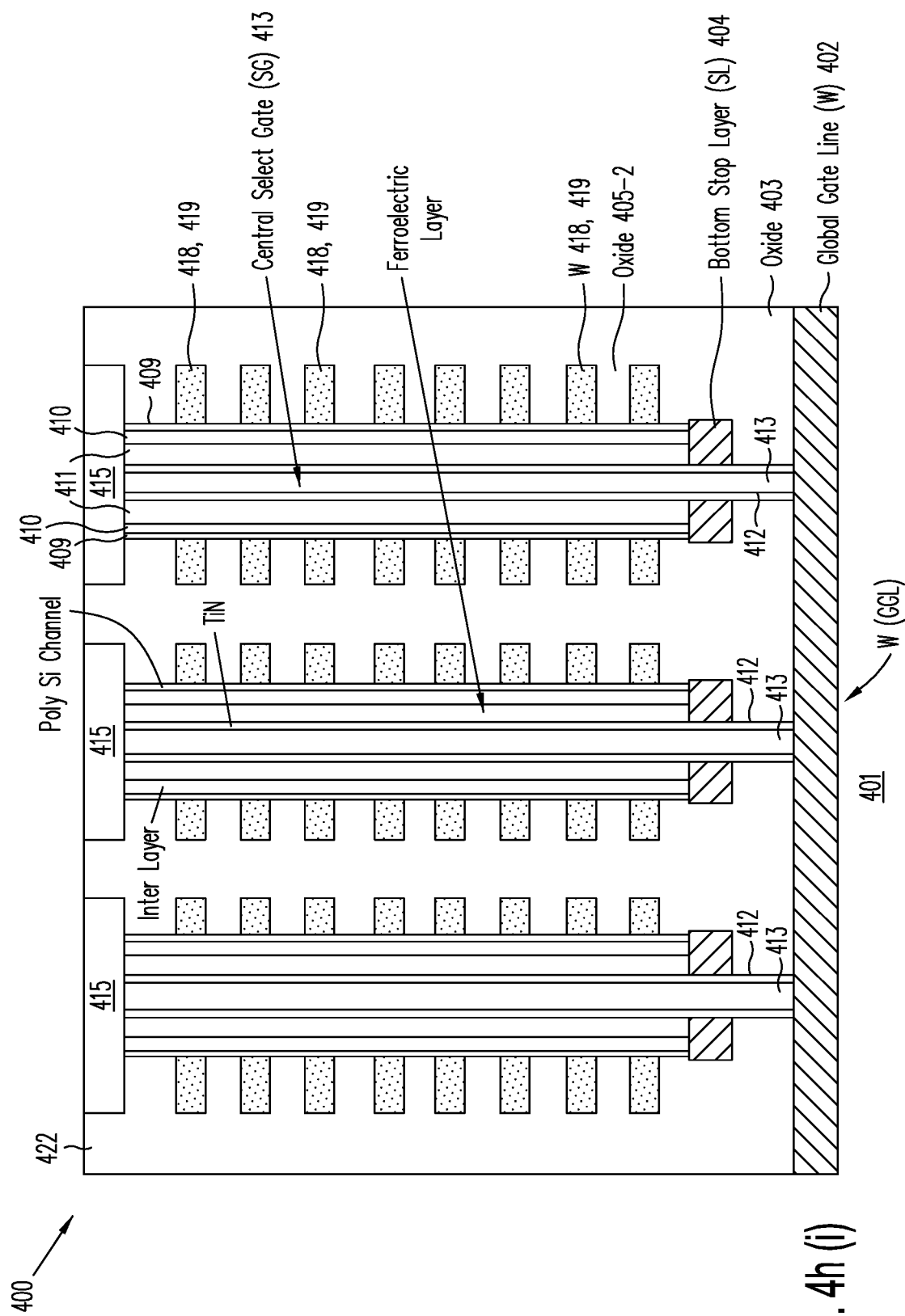

Thereafter, top isolation layer 415 (e.g., silicon nitride) is provided over memory array 400. Top isolation layer 415 is then patterned and an etch step creates slots 414 (e.g., slots 414-1, 414-2, 414-3 and 414-4) through top isolation layer 415 and the alternating silicon nitride layers 406 and oxide layers 405. The resulting structure (vertical section) is shown in FIG. 4*h*(i). FIG. 4*h*(ii) shows a horizontal cross section of memory array 400 through one of nitride layers 406.

Figure 4I:
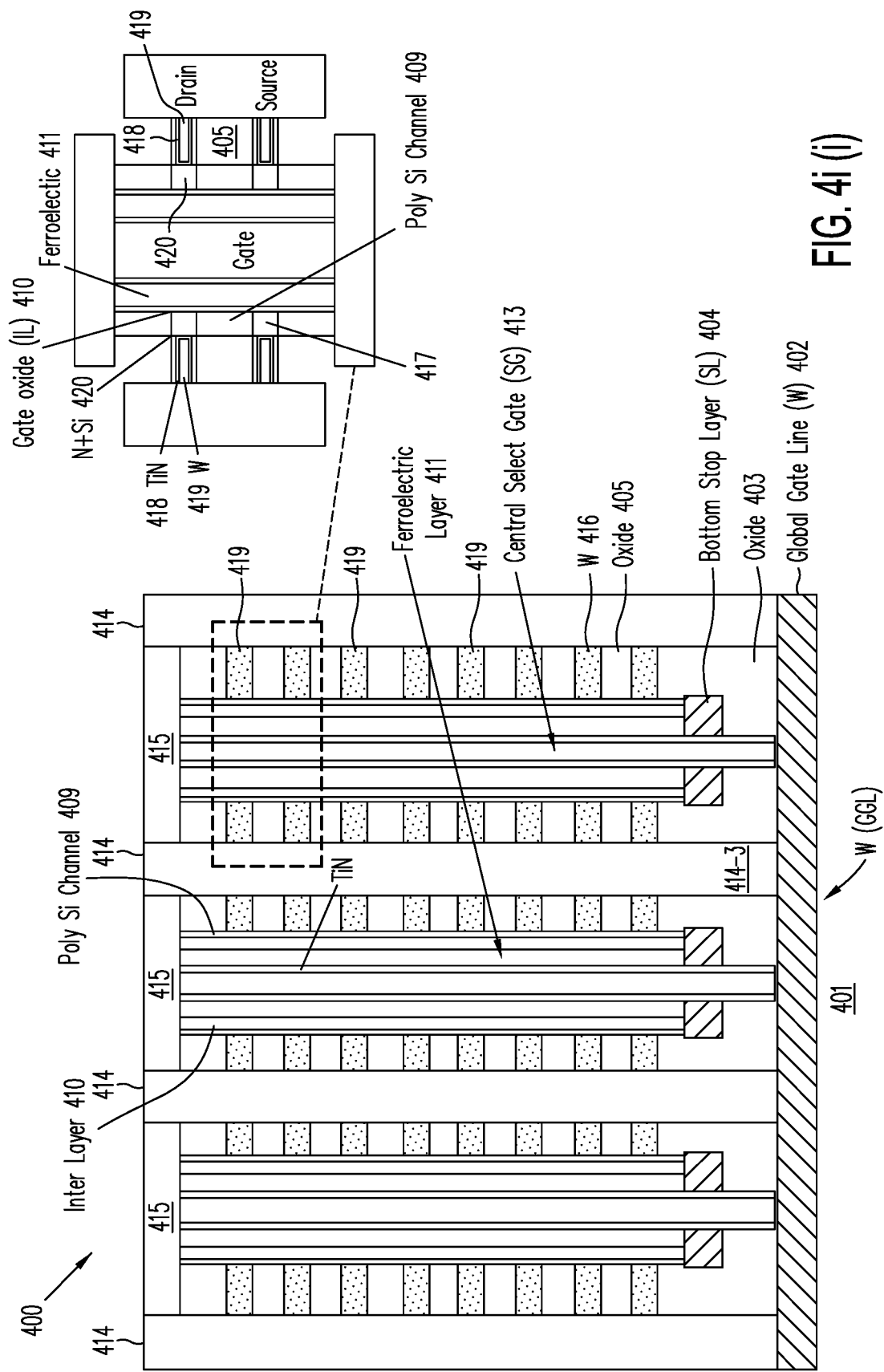

A wet etch step (e.g., hot phosphoric acid) is carried out to remove the silicon nitride layers 406. During this step, the silicon nitride material is removed from the exposed surfaces of silicon nitride layers 406 in the sidewalls of slots 414. A further etch step removes exposed portions of channel polysilicon 409 and gate oxide 410. A layer of n$^+$ polysilicon layer 420 is then deposited and annealed. TiN layer 418 and tungsten 419 are then deposited successively to fill the voids left over from removing the silicon nitride. Excess n$^+$ polysilicon, TiN and tungsten materials are removed from the top of the structure and the sidewalls of slots 414. The resulting structure is shown in vertical and horizontal cross sections in FIGS. 4*i*(i) and 4*i*(ii), respectively. In FIG. 4*i*(i), the resulting structure is magnified in inset where the top two silicon nitride layers 406 (i.e., silicon nitride layers 406-*n* and 406-(*n*−1)) have been removed. As shown in the inset, in each of the silicon nitride layer, (a) n$^+$ polysilicon layer 420 forms pockets in channel polysilicon layer 409 and gate oxide layer 410 after thermal anneal diffusion, (b) TiN layer 418 lines the outside of n$^+$ layer 420, and (c) tungsten layer 419 fills the remainder of the voids. The pockets of n$^+$ polysilicon layer 420 become drain and source regions of an MFIS transistor. TiN layers 418 and tungsten layers 419 become source or drain electrodes 423.

Figure 4J:
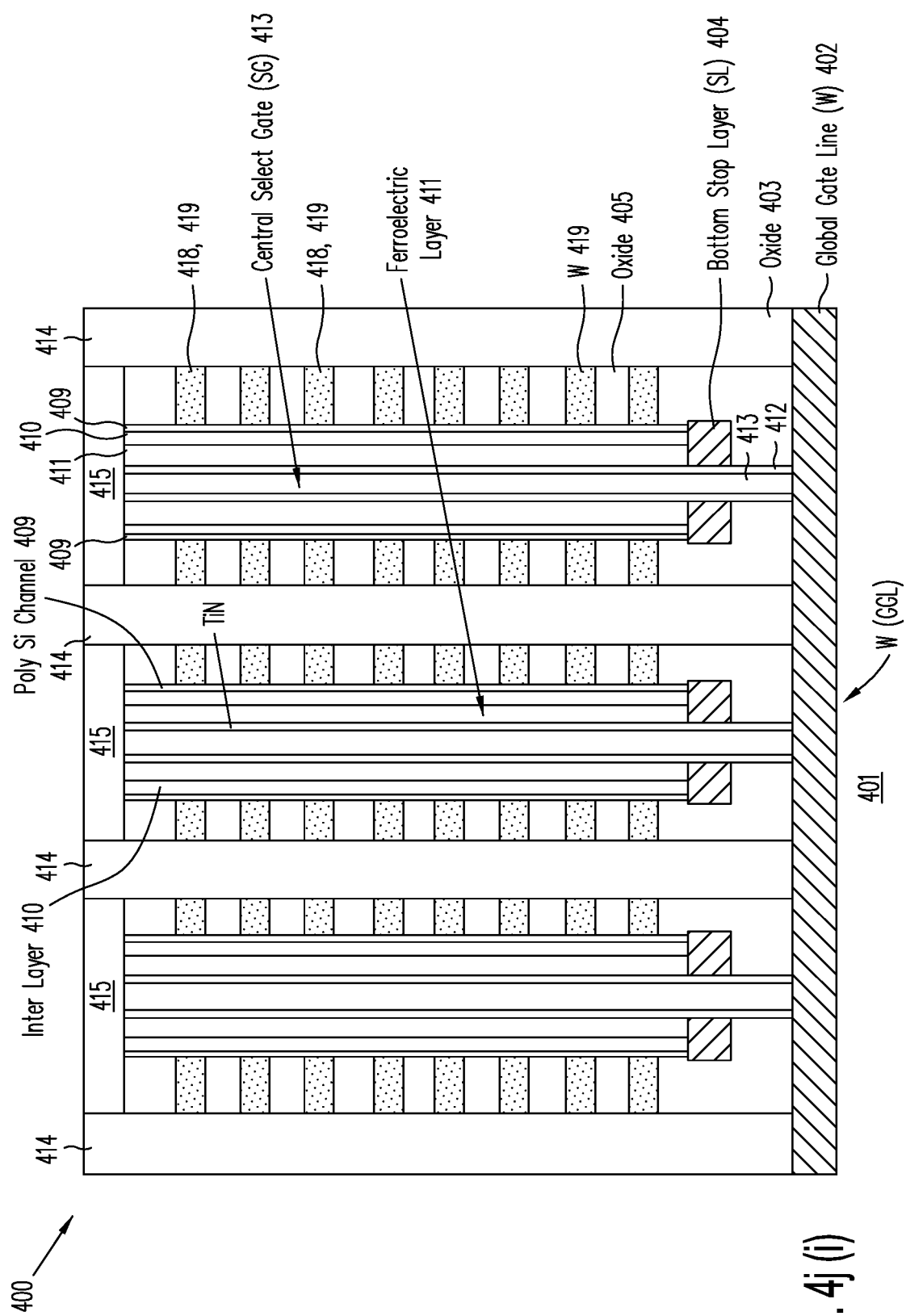

In some embodiments, silicon nitride layers 406 is not completely removed. As etching of silicon nitride layers 406 proceeds from the sidewalls of slots 414, so that a strip of silicon nitride divides and electrically the resulting source or drain terminals isolates on opposite sides of each memory hole. In this manner, each memory hole now provides two vertical 3-D FeFET strings, as the n$^+$ polysilicon pockets on opposite sides of each silicon nitride layer of each memory hole form separate drain or source regions. This alternative embodiment is illustrated in the structure is shown in vertical and horizontal cross sections in FIGS. 4*j*(i) and 4*j*(ii), respectively. As shown in FIG. 4*j*(ii), silicon nitride layers 421, which is left over from the incomplete removal of silicon nitride layers 406 provide separate sets 423L and 423R of drain or source electrodes.

Figure 4K:
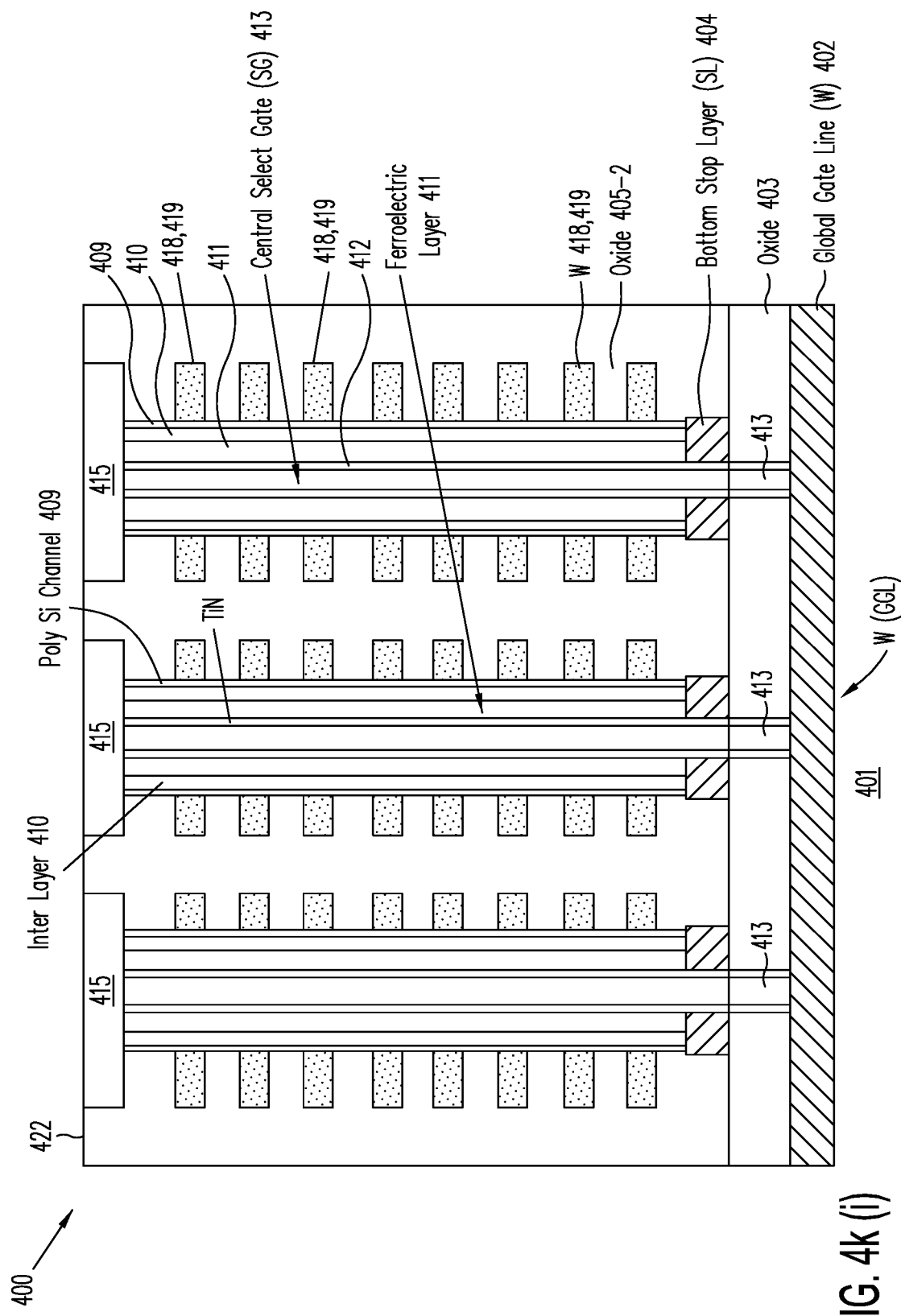
Figure 4L:
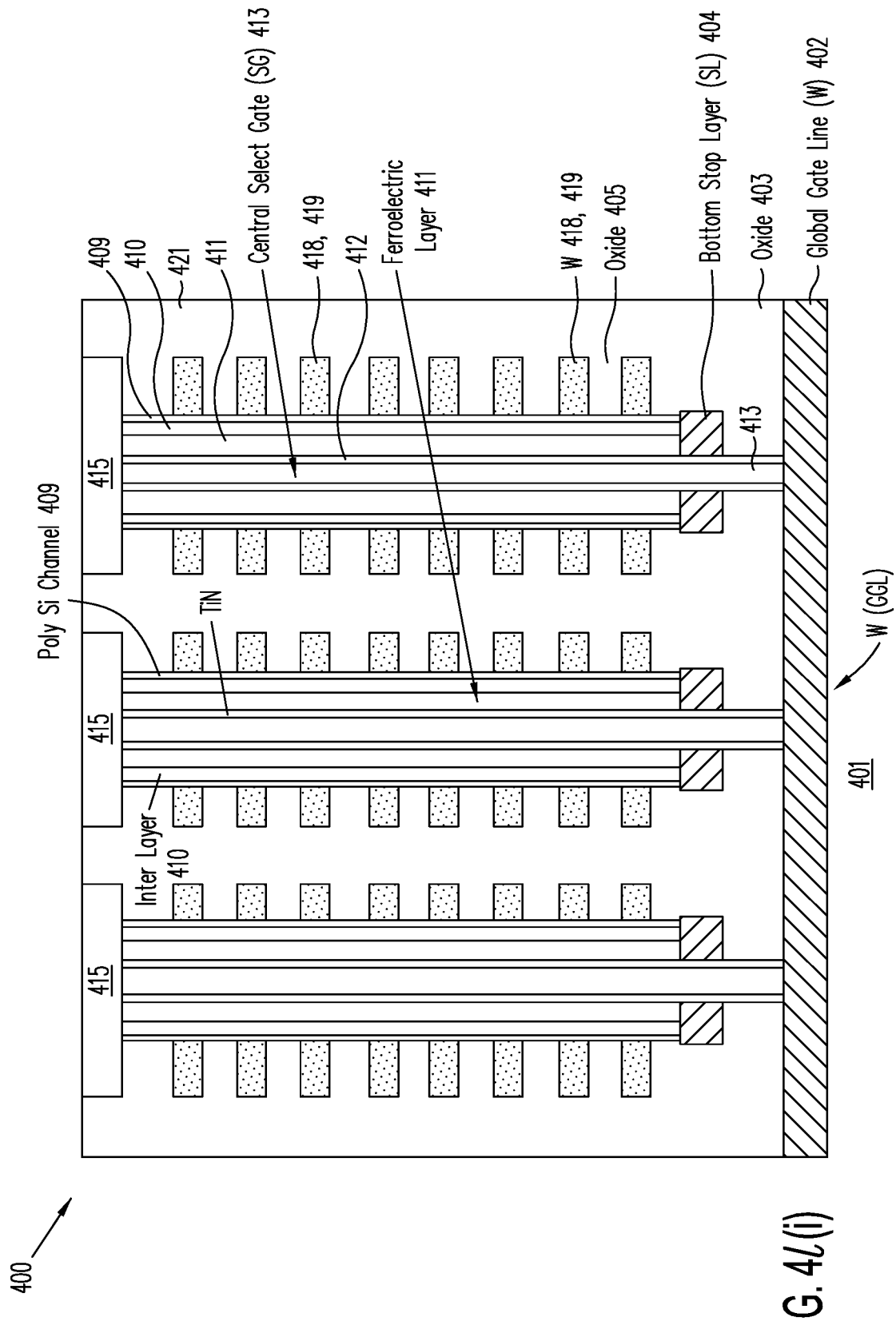

Silicon oxide 422 is then deposited to fill slots 414. A CMP step removes excess silicon oxide from the top of memory array 400. The resulting structure in vertical and horizontal cross sections are shown in FIGS. 4*k*(i) and 4*k*(ii), respectively, for the embodiment of FIGS. 4*i*(i) and 4*i*(ii). Likewise, the resulting structure in vertical and horizontal cross sections are shown in FIGS. 4*l*(*i*) and 4*l*(*ii*), respectively, for the embodiment of FIGS. 4*j*(i) and 4*j*(ii).

Figure 5:
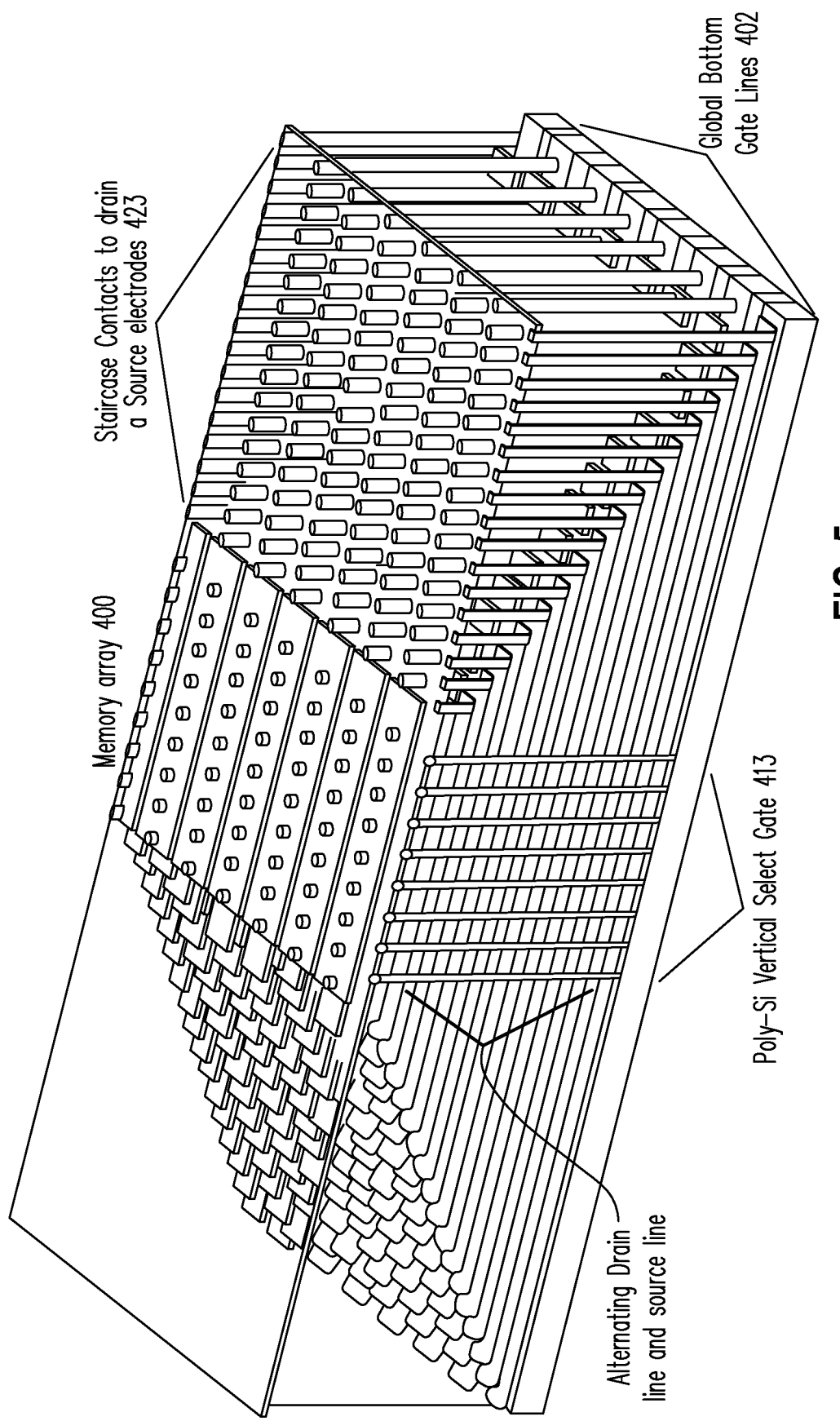
FIG. 5 shows memory array 400 provided electrical contacts or connections to drain or source electrodes 423 via staircase structures on both sides of memory array 400 and contacts or connections to gate electrodes 423 using the bottom global word lines (e.g., global word line 401).

Connections to the drain or source electrodes 423 (or 423L and 423R, in the alternative embodiment) can be made using the staircase configuration used in 3-D NAND non-volatile memory arrays. FIG. 5 shows memory array 400 provided electrical contacts or connections to drain or source electrodes 423 via staircase structures on both sides of memory array 400 and contacts or connections to gate electrodes 413 using the bottom global gates (e.g., global gate 402). The staircase configuration and associated fabrication methods are known to those of ordinary skill in the art.

In one embodiment, the polarization switching voltages are ±1.5 volts across the ferroelectric capacitor layer of the MFIS for "1" and "0" states, respectively. During a programming or an erase operation, the voltage across the ferroelectric layer is roughly half of the gate-to-source voltage ($V_{GS}$) of the MRS. Thus, programming of the MFIS may be achieved using a programming voltage $V_{PGM}$ of 6-7 volts at the gate electrode. Table 1 shows the voltage biases for MFIS transistors in memory array 400 during a programming operation:

TABLE 1

| MFIS TYPE | Gate Voltage | Drain Voltage | Source Voltage |
|---|---|---|---|
| Selected cell | $V_{PGM}$ | 0.0 | 0.0 |
| Selected Gate, non-selected source or drain | $V_{PGM}$ | ⅔ $V_{PGM}$ | ⅔ $V_{PGM}$ |
| Non-selected gate, selected drain or source | ⅓ $V_{PGM}$ | 0.0 | 0.0 |
| Non-selected gate, non-selected drain or source | ⅓ $V_{PGM}$ | ⅔ $V_{PGM}$ | ⅔ $V_{PGM}$ |

As shown in Table 1, program disturb is avoided in the non-selected MFIS transistors because in each case, the magnitude of half gate-to-source voltage ($V_{GS}$) is less than ⅓ $V_{PGM}$, which is by design less than the polarization switching voltage for state "0".

Similarly, an erase operation on an MFIS transistor may be achieved using an erase voltage $V_{ERA}$ of 6-7 volts at the gate electrode. Table 2 shows the voltage biases for MFIS transistors in memory array 400 during an erase operation:

TABLE 2

| MFIS TYPE | Gate Voltage | Drain Voltage | Source Voltage |
|---|---|---|---|
| Selected cell | 0.0 | $V_{ERA}$ | $V_{ERA}$ |
| Selected Gate, non-selected source or drain | 0.0 | ⅓ $V_{ERA}$ | ⅓ $V_{ERA}$ |
| Non-selected gate, selected drain or source | ⅔ $V_{ERA}$ | $V_{ERA}$ | $V_{ERA}$ |
| Non-selected gate, non-selected drain or source | ⅔ $V_{ERA}$ | $V_{ERA}$ | $V_{ERA}$ |

As shown Table 2, erase disturb is avoided in the non-selected MFIS transistors because in each case, the magnitude of half the gate-to-source voltage ($V_{GS}$) are less than ⅓ $V_{ERA}$, which is by design less than the polarization switching voltage for state "1".

A read operation may be achieved using a read voltage $V_{READ}$ of 0.0-0.5 volts at the gate electrode and drain voltage $V_{DD}$ at 0.5-2.0 volts. Table 3 shows the voltage biases for MFIS transistors in memory array 400 during a read operation:

TABLE 3

| MFIS TYPE | Gate Voltage | Drain Voltage | Source Voltage |
|---|---|---|---|
| Selected cell | $V_{READ}$ | $V_{DD}$ | 0.0 |
| Selected Gate, non-selected source or drain | $V_{READ}$ | 0.0 | 0.0 |
| Non-selected gate, selected drain or source | 0.0 or negative | $V_{DD}$ | 0 |
| Non-selected gate, non-selected drain or source | 0.0 or negative | 0.0 | 0.0 |

As shown Table 3, MFIS transistors not on the same word line (i.e., non-selected gate electrodes) are provided a gate voltage of 0.0 volts or less, which results in a very low current drawn in these transistors.

Figure 6C:
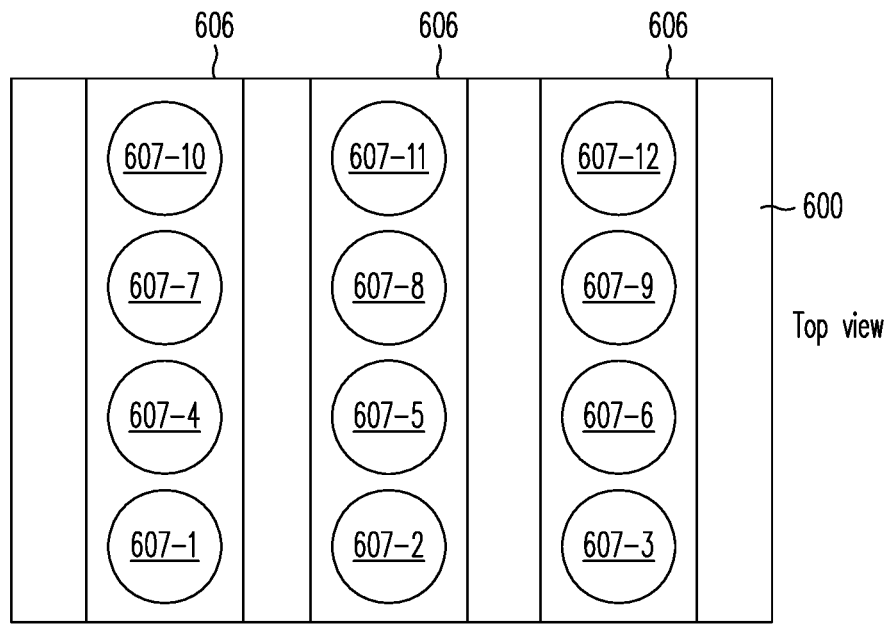
Figure 6C:
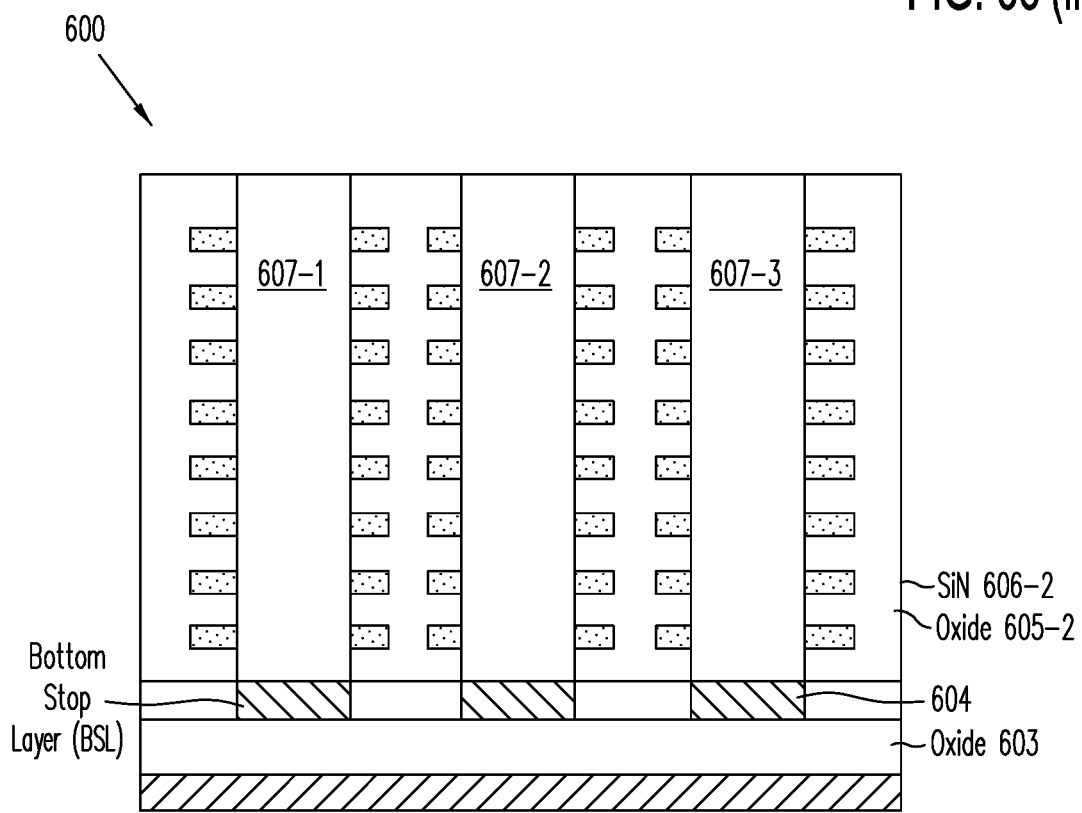

FIGS. 6a-6j illustrate an exemplary fabrication process for memory array 600, in accordance with one embodiment of the present invention. Unlike memory array 400, the gate electrodes of the MFIS transistors in memory array 600 are not connected by a network of global gate lines formed underneath the memory array. Instead, as shown in vertical section FIG. 6a, oxide layer 603 (e.g., silicon oxide) and bottom etch stop layer 604 (e.g., silicon nitride) are deposited in succession over a planar surface of semiconductor substrate 601. Etch stop layer 604 may be patterned, as shown, and embedded in oxide layer 603. Then, as shown in vertical section in FIG. 6b, alternating layers of silicon oxide layers 605 and silicon nitride layers 606 are deposited, numbered herein as silicon oxide layers 605-1, . . . , and 605-n, and silicon nitride layers 606-1, . . . , 606-n, respectively. An array of memory holes 607 (e.g., memory holes 607-1, 607-2 and 607-3) are then etched through the alternating layers of silicon oxide layers 605 and silicon nitride layers 606 down to etch stop layer 604, as shown in vertical section in FIG. 6c(i). FIG. 6c(ii) shows in horizontal cross section through one of silicon nitride layers 606, showing memory holes 607-1 to 607-9 of memory array 600 at this step of formation.

Figure 6D:
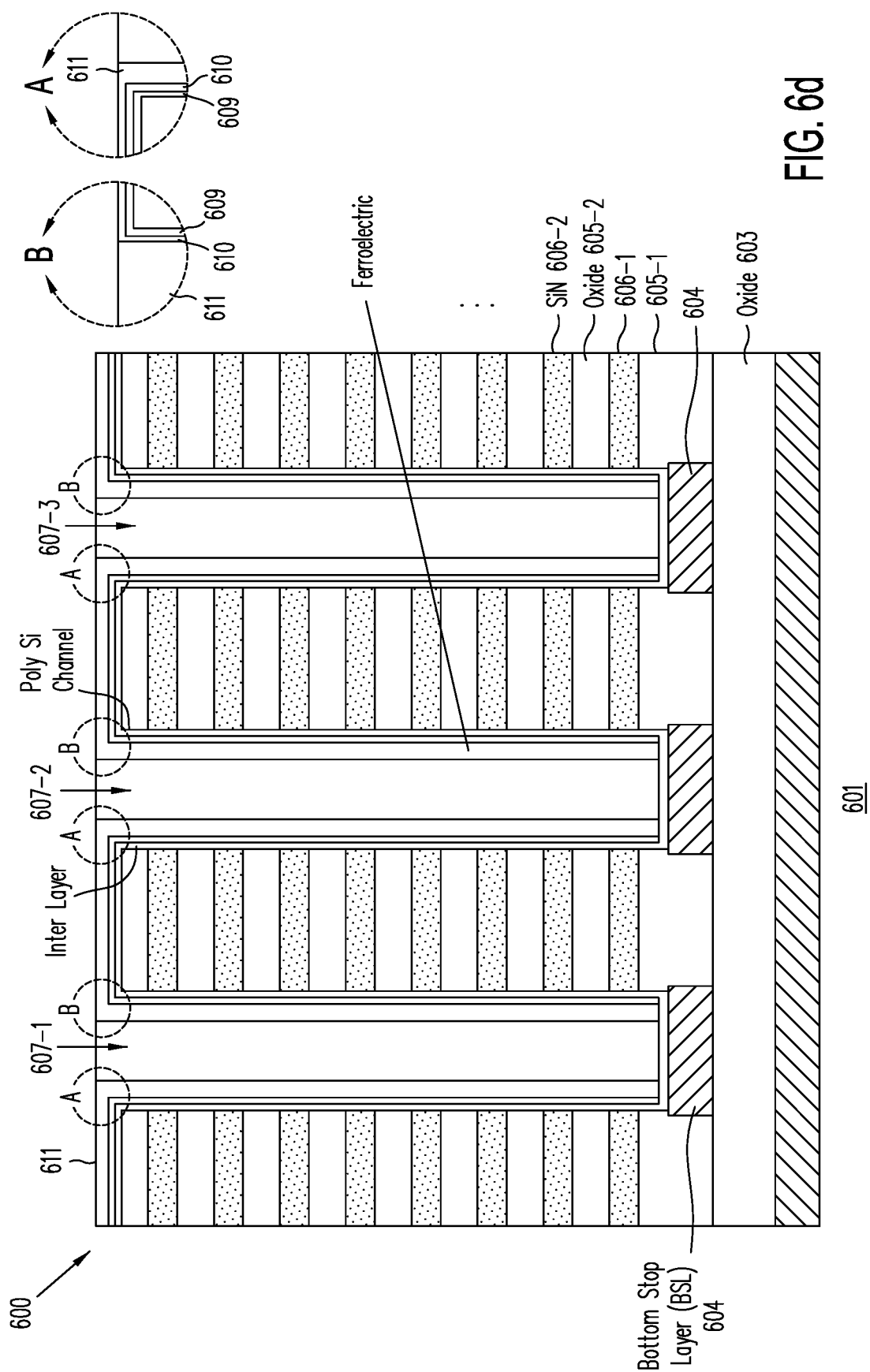

Polysilicon layer 609 is then conformally deposited, followed by deposition of thin gate oxide layer 610. Polysilicon 609 may be deposited as amorphous silicon and annealed at 850° C. for 2 hours to crystallize. Ferroelectric layer 611 (e.g., a Si-doped or Zr-doped $Hf_{1-x}Si_xO_y$, $Hf_xZr_{1-x}O_y$ ferroelectric thin-film) is then deposited. The resulting structure (vertical section) is shown in FIG. 6d.

Figure 6E:
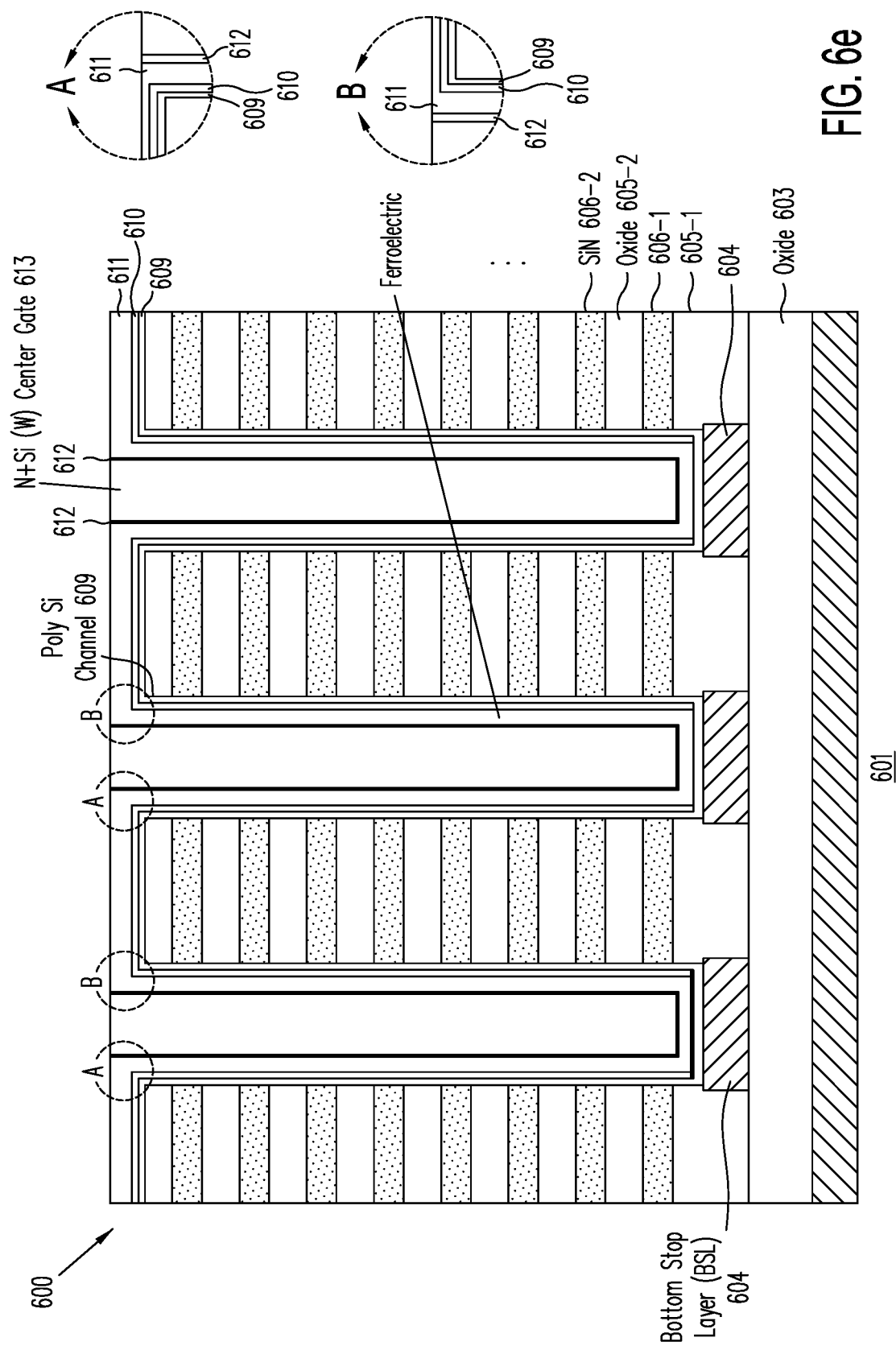

An adhesion/barrier layer of titanium nitride (TiN) 612 is then conformally deposited. Memory holes 607 are then filled with gate electrode material 613, which may be a CVD W or an $n^+$ polysilicon. A CMP step removes excess gate oxide material 613 from the top of memory array 600. The resulting structure (vertical section) is shown in FIG. 6e.

Figure 6F:
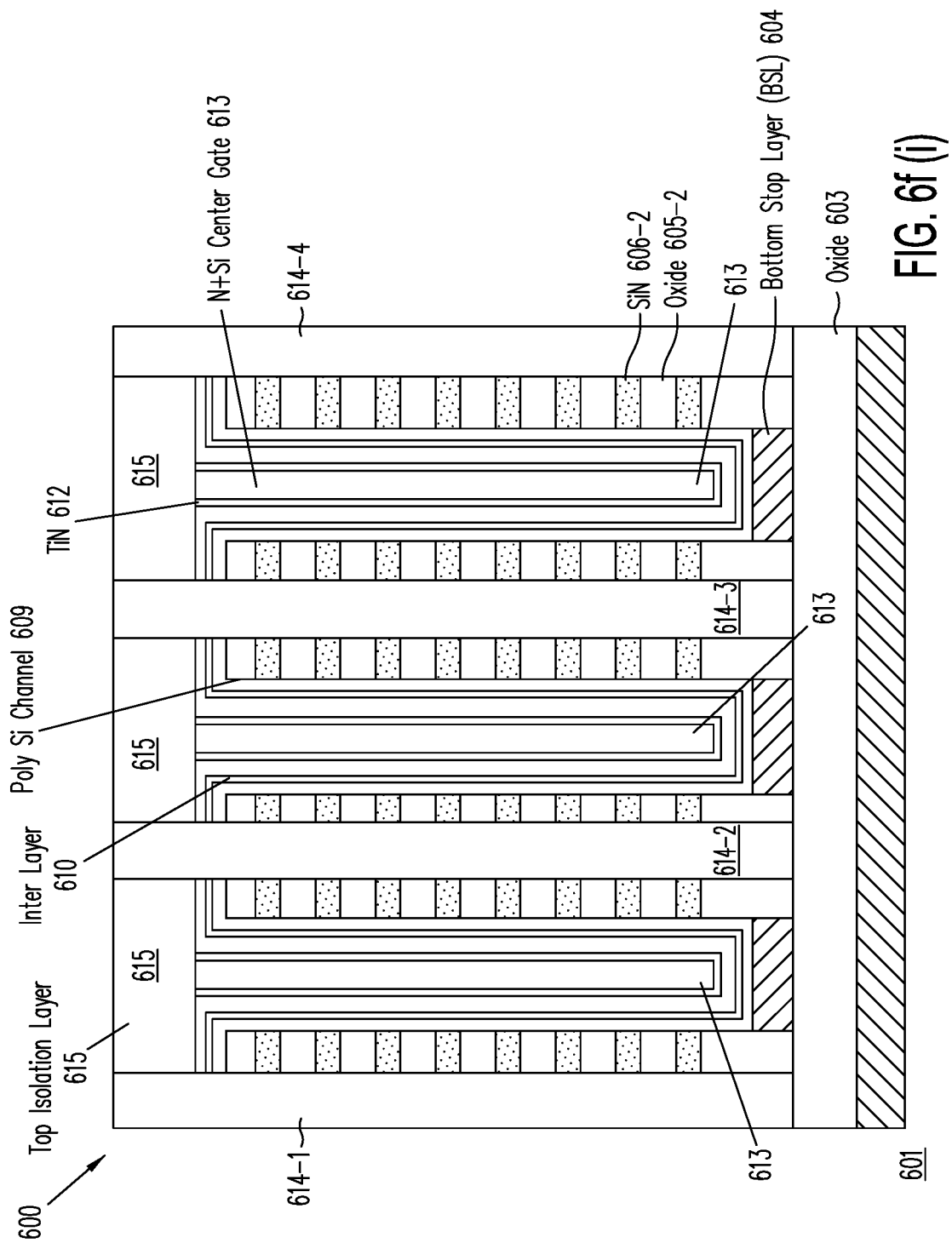

Thereafter, top isolation layer 615 (e.g., silicon nitride) is provided over memory array 600. Top isolation layer 615 is then patterned and an etch step creates slots 614 (e.g., slots 614-1, 614-2, 614-3 and 614-4) through top isolation layer 615, TiN layer 612, ferroelectric layer 611, gate oxide layer 610, channel polysilicon layer 609 and the alternating silicon nitride layers 606 and oxide layers 605. The resulting structure (vertical section) is shown in FIG. 6f(i). FIG. 6f(ii) shows a horizontal cross section of memory array 600 through one of nitride layers 606.

Figure 6G:
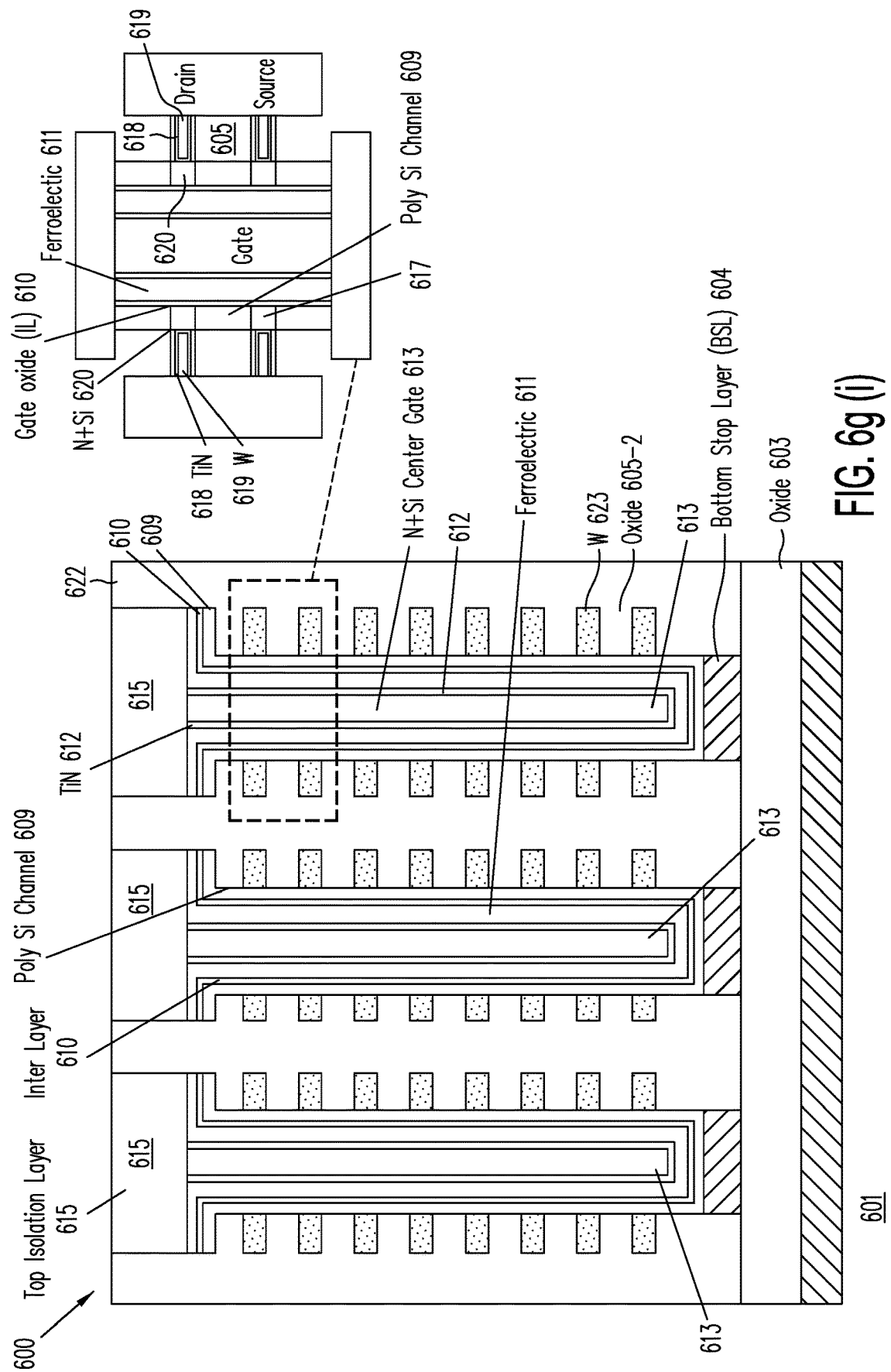
Figure 6H:
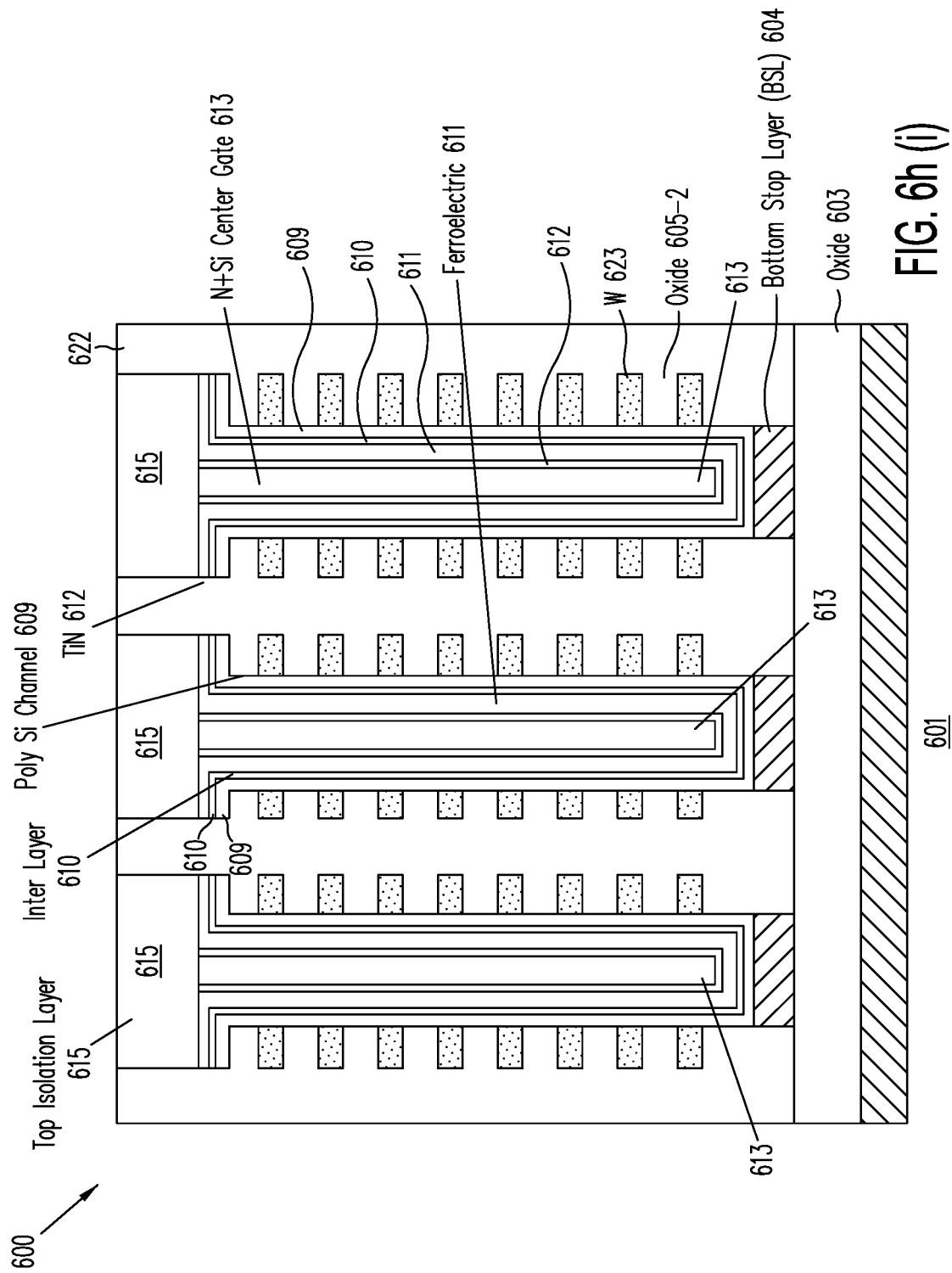
Figure 6I:
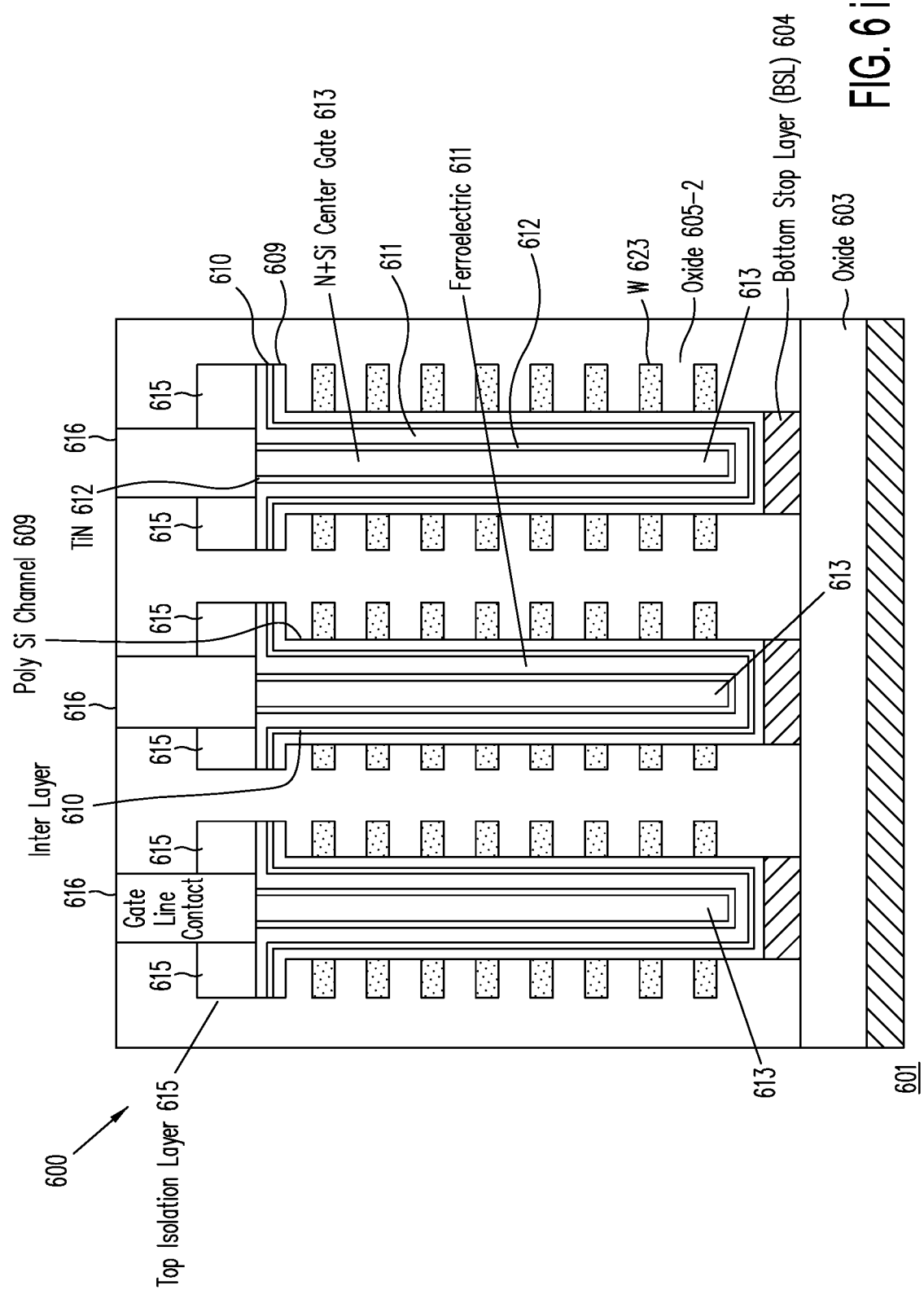

An etch step (hot phosphoric acid) is carried out to remove the silicon nitride layers 606. During this step, the silicon nitride material is removed from the exposed surfaces of silicon nitride layers 606 in the sidewalls of slots 614. A further etch step removes exposed portions of channel polysilicon 609 and gate oxide 610. A layer of $n^+$ polysilicon layer 620 is then deposited and annealed. TiN layer 618 and tungsten 619 are then deposited successively to fill the voids left over from removing the silicon nitride. Excess $n^+$ polysilicon, TiN and tungsten materials are removed from the top of the structure and the sidewalls of slots 614, in substantially. These steps are provided in substantially the same manner as discussed above with respect to vertical and horizontal cross sections in FIGS. 4i(i) and 4i(ii), respectively. The pockets of $n^+$ polysilicon layer 620 become drain and source regions of an MFIS transistor. TiN layers 618 and tungsten layers 619 become source or drain electrodes 623. Silicon oxide 622 is then deposited to fill slots 614. A CMP step removes excess silicon oxide from the top of memory array 600. The resulting structure in vertical and horizontal cross sections are shown in FIGS. 6g(i) and 6g(ii), respectively, As discussed above with respect to FIGS. 4*j*(i) and 4*j*(ii), in some embodiments, silicon nitride layers 606 is not completely removed. As etching of silicon nitride layers 606 proceeds from the sidewalls of slots 614, so that a strip of silicon nitride divides and electrically the resulting source or drain terminals isolates on opposite sides of each memory hole. In this manner, each memory hole now provides two vertical 3-D FeFET strings, as the n⁺ polysilicon pockets on opposite sides of each silicon nitride layer of each memory hole form separate drain or source regions. This alternative embodiment is illustrated in the structure is shown in vertical and horizontal cross sections in FIGS. 6*h*(i) and 6*h*(ii), respectively. As shown in FIG. 6*h*(ii), silicon nitride layers 621, which is left over from the incomplete removal of silicon nitride layers 606 provide separate sets 623L and 623R of drain or source electrodes.

Figure 6J:
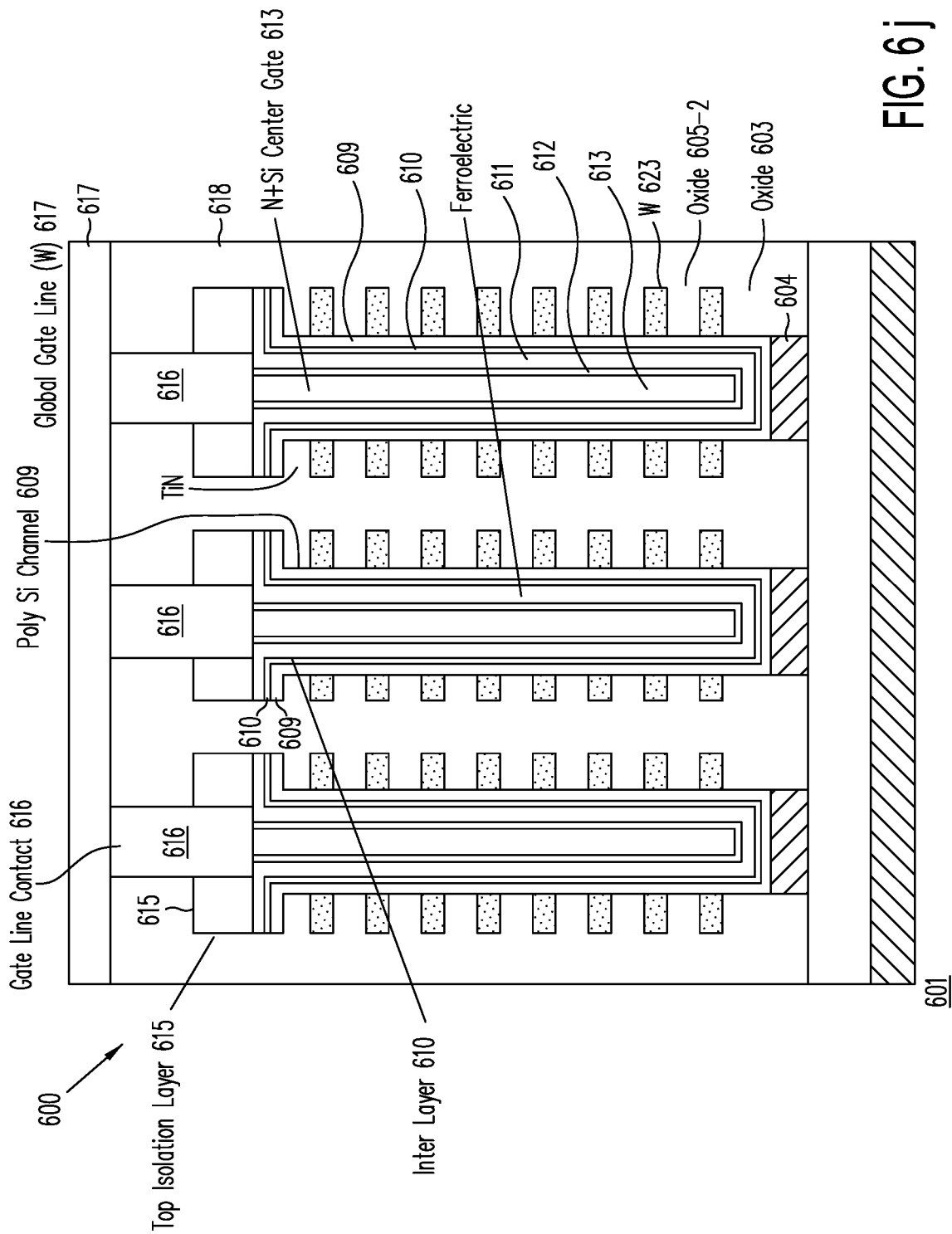

Silicon oxide layer 618 is deposited over top isolation layer 615, filling any gap on memory array 600 and planarized by a CMP step. Thereafter, silicon oxide layer 618 is patterned. An etch step creates via through silicon oxide layer 618 and top isolation layer 615 to expose gate electrode material 613. Metallic conductor (e.g., TiN and tungsten plug) 616 is then provided to fill the vias. A CMP step planarizes the surface of memory array 600. The resulting structure is shown in vertical section in FIG. 6*i*. Thereafter, top global gates (e.g., global gate 617) are provided above silicon oxide layer 618 to electrically connect gate electrodes 613 through the conductor-filled vias, as shown in FIG. 6*j*.

FIGS. 7*a*-7*g* illustrate an exemplary fabrication process for memory array 700, in accordance with one embodiment of the present invention. Unlike the MFIS transistors of memory arrays 400 and 600 discussed above, an MFIS transistor of memory 700 includes an additional charge-storage layer between the gate oxide layer and the ferroelectric layer.

Figure 7A:
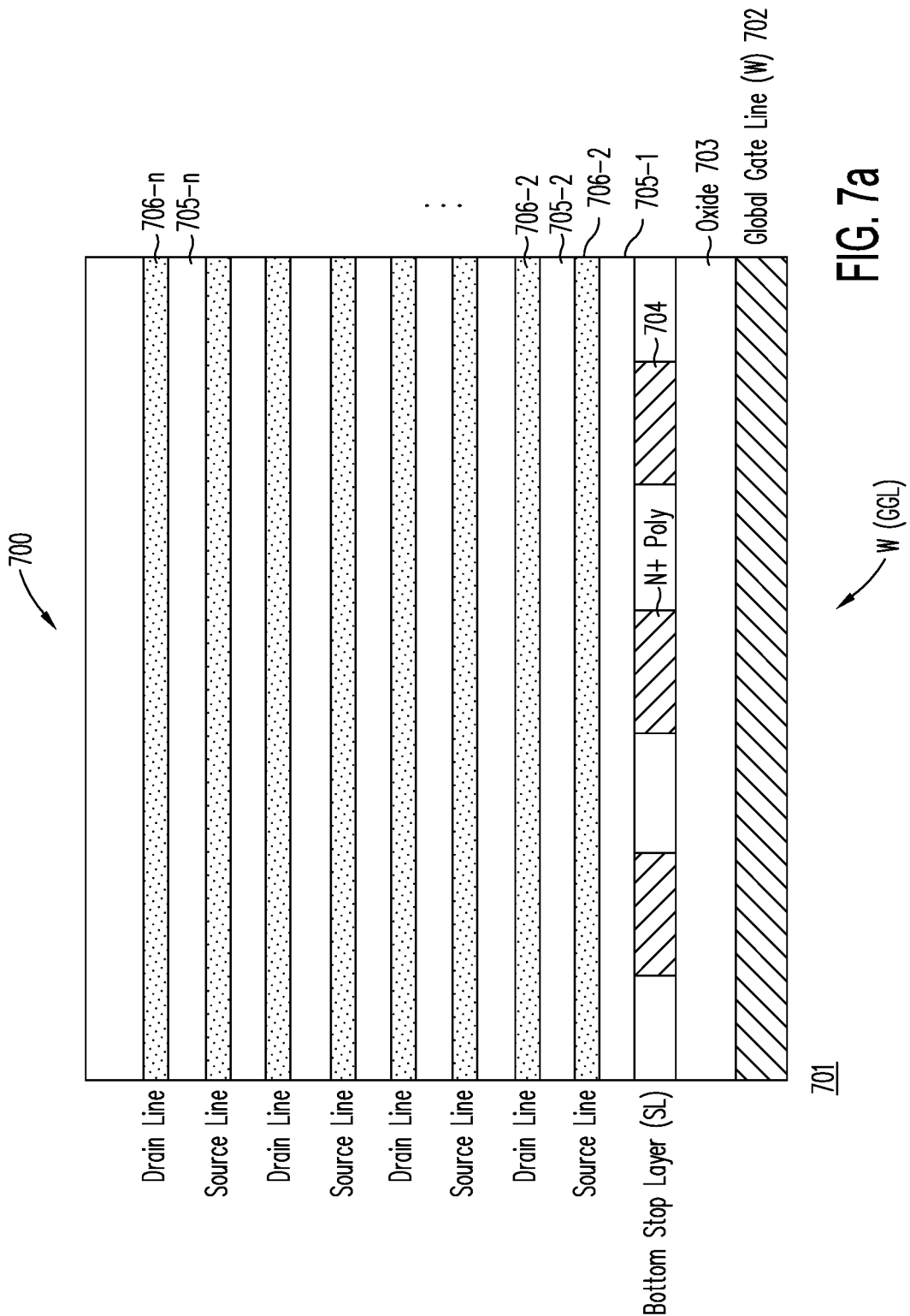
FIGS. 7a-7g illustrate an exemplary fabrication process for memory array 700, in accordance with one embodiment of the present invention.
Figure 7B:
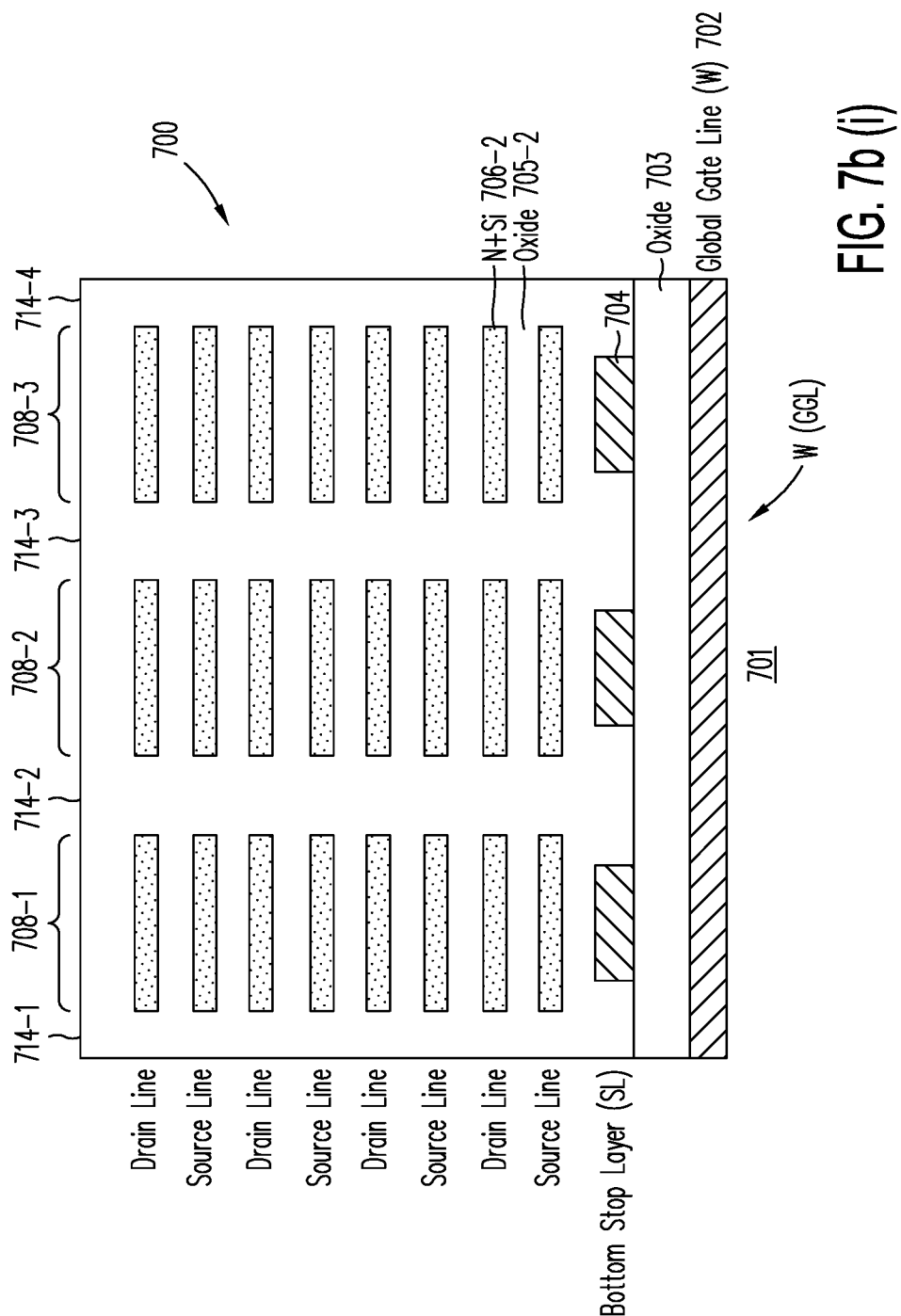

FIG. 7*a* shows memory array 700 after (i) a network of global gate lines (e.g., tungsten), including global gate line 702, are formed over semiconductor substrate 701, which may be a semiconductor wafer, and (ii) oxide layer 703 (e.g., silicon oxide) and bottom etch stop layer 704 (e.g., n⁺ polysilicon) are deposited over the global gate lines; and (iii) alternating layers of silicon oxide layers 705 and n⁺ polysilicon 706 are deposited, numbered herein as silicon oxide layers 705-1, . . . , and 705-*n*, and n⁺ polysilicon layers 706-1, . . . , 706-*n*, respectively. The structure of FIG. 7*a* may be formed using substantially the same steps as those described above with respect to FIGS. 4*a*-4*c*, except conductive n⁺ polysilicon material replaces silicon nitride in the alternating layers. Using n⁺ polysilicon is an option for drain and source electrodes, although n⁺ polysilicon has a higher resistivity than metal. However, if metal is selected for drain and source electrodes, a metal replacement step (see, e.g., FIGS. 4*i* and 4*j* for memory array 400 and FIGS. 6*f* and 6*g* for memory array 600) may be required.

Slots 714 may be created at this time, instead of after the MFIS transistors have been substantially formed (see, e.g., FIGS. 4*h*(i) and 6*f*(i), which creating slots 414 of memory array 400 and slots 614 of memory array 600), because the metal replacement step is not necessary. (The metal replacement steps access the silicon nitride layers through the slots.) Slots 714, which divide memory array 700 into sections 708, may then be filled with oxide, as shown in vertical and horizontal sections in FIGS. 7*b*(i) and 7*b*(ii).

Figure 7C:
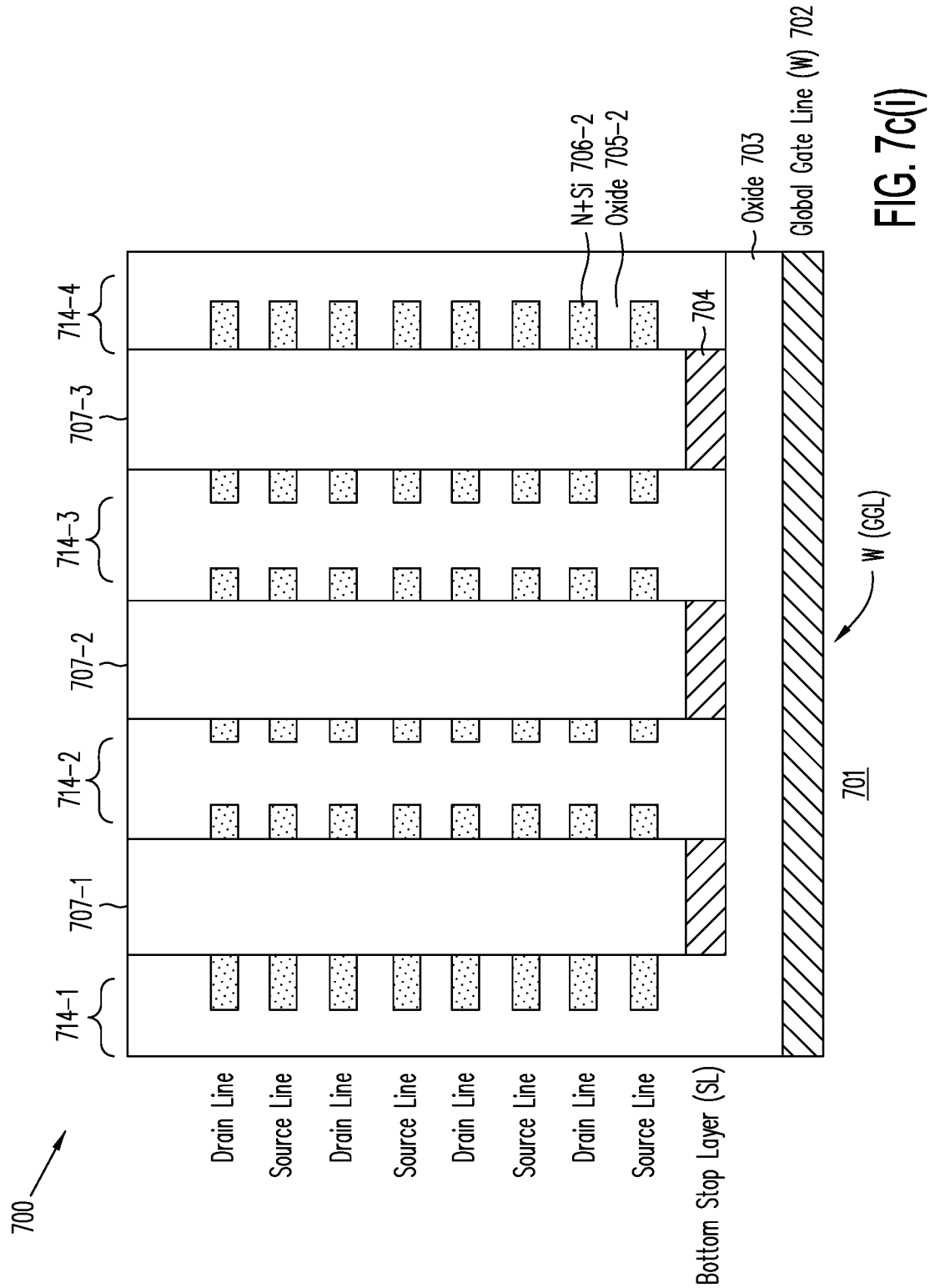
Figure 7D:
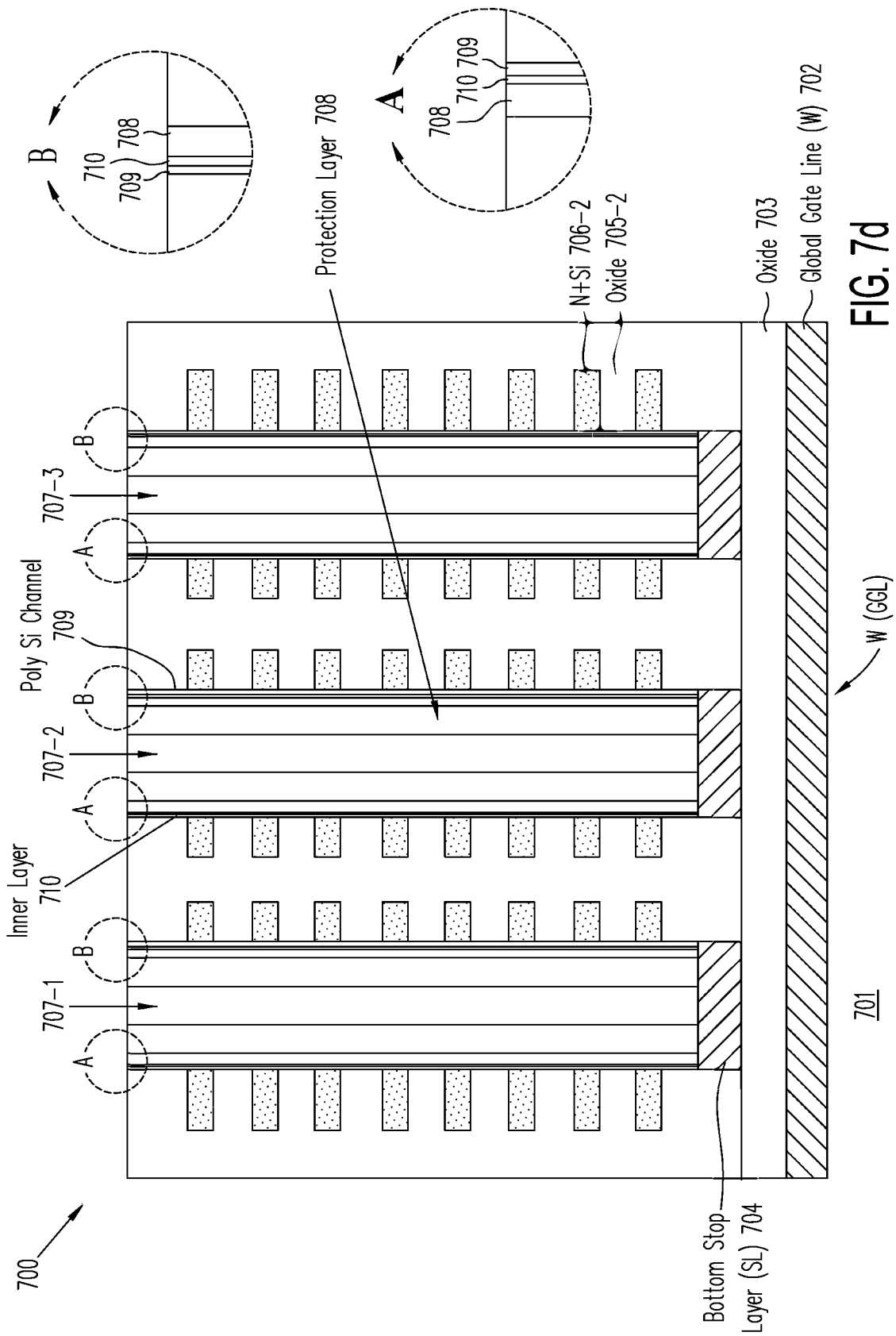
Figure 7E:
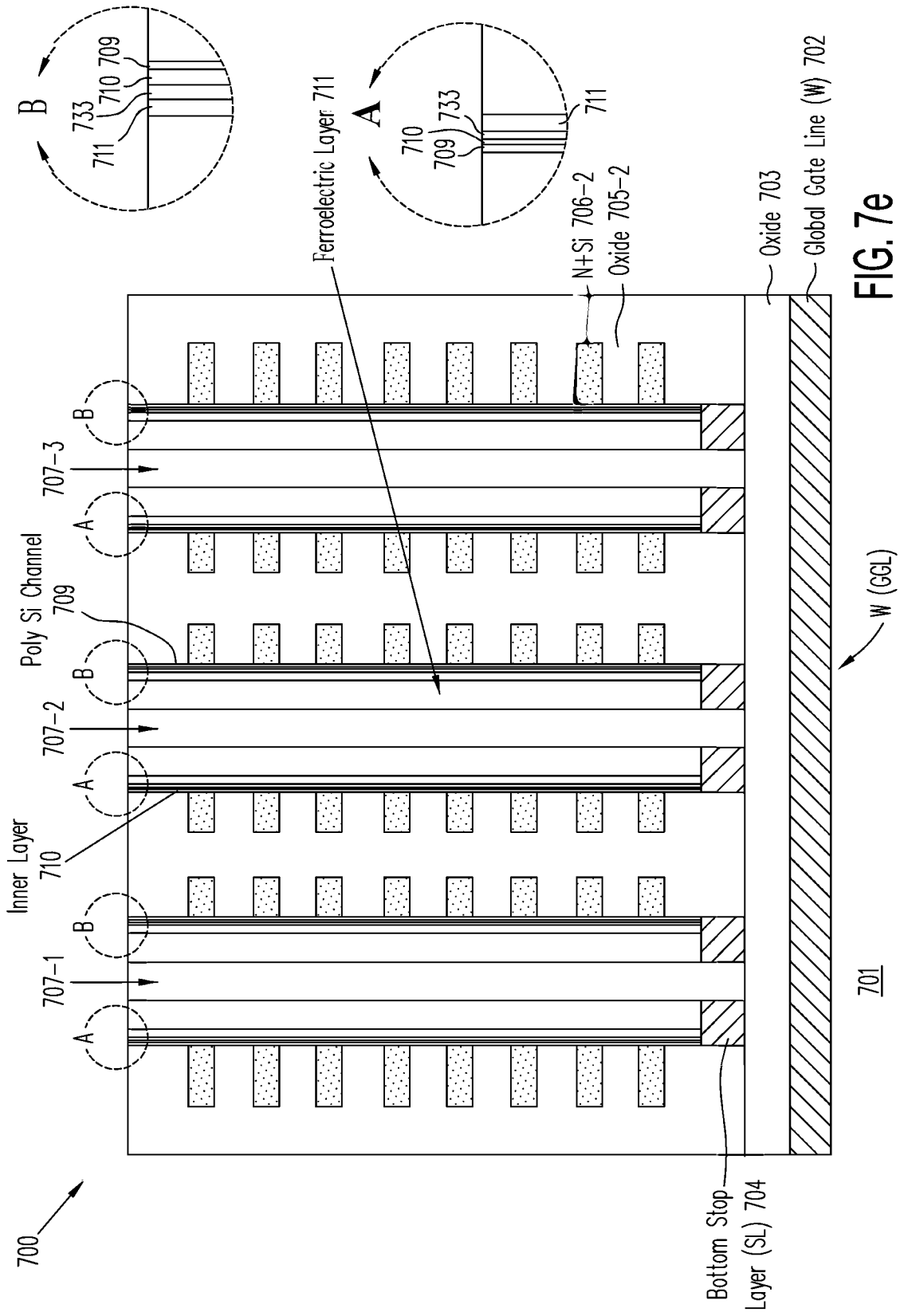

Memory holes 707 (e.g., memory holes 407-1, 407-2 and 407-3) are then etched through the alternating layers of silicon oxide layers 705 and n⁺ polysilicon layers 706 down to etch stop layer 704, as shown in vertical section in FIG. 7*c*(i). FIG. 7*c*(ii) shows in horizontal cross section through one of n⁺ polysilicon layers 706, showing memory holes 707-1 to 707-9 of memory array 700 at this step of formation.

Polysilicon layer 709 is then conformally deposited, followed by deposition of thin gate oxide layer 710. Polysilicon 709 may be deposited as amorphous silicon and annealed at 850° C. for 2 hours to crystallize. Protective layer 708 may then be deposited over gate oxide layer 710. A spacer etch is then carried out to remove any deposited polysilicon and gate oxide from the bottom of memory holes 707. A CMP step may be carried out to remove materials of protective layer 708, gate oxide 710, and polysilicon layer 709 from the top of the structure. The resulting structure (i.e., memory array 700 at this step of formation) is shown in vertical section in FIG. 7*d*.

Protective layer 708 is then removed. Thereafter, charge-trapping layer 733 is conformally deposited. An anisotropic etch then removes the charge-trapping material at the bottom of memory holes 707 to expose the underlying etch stop layer 704. The exposed portions of etch stop layer 704 and the portions of oxide layer 703 are removed in successive etching steps to create vias that expose the global gate lines underneath. The resulting structure is shown in vertical section in FIG. 7*e*.

Figure 7F:
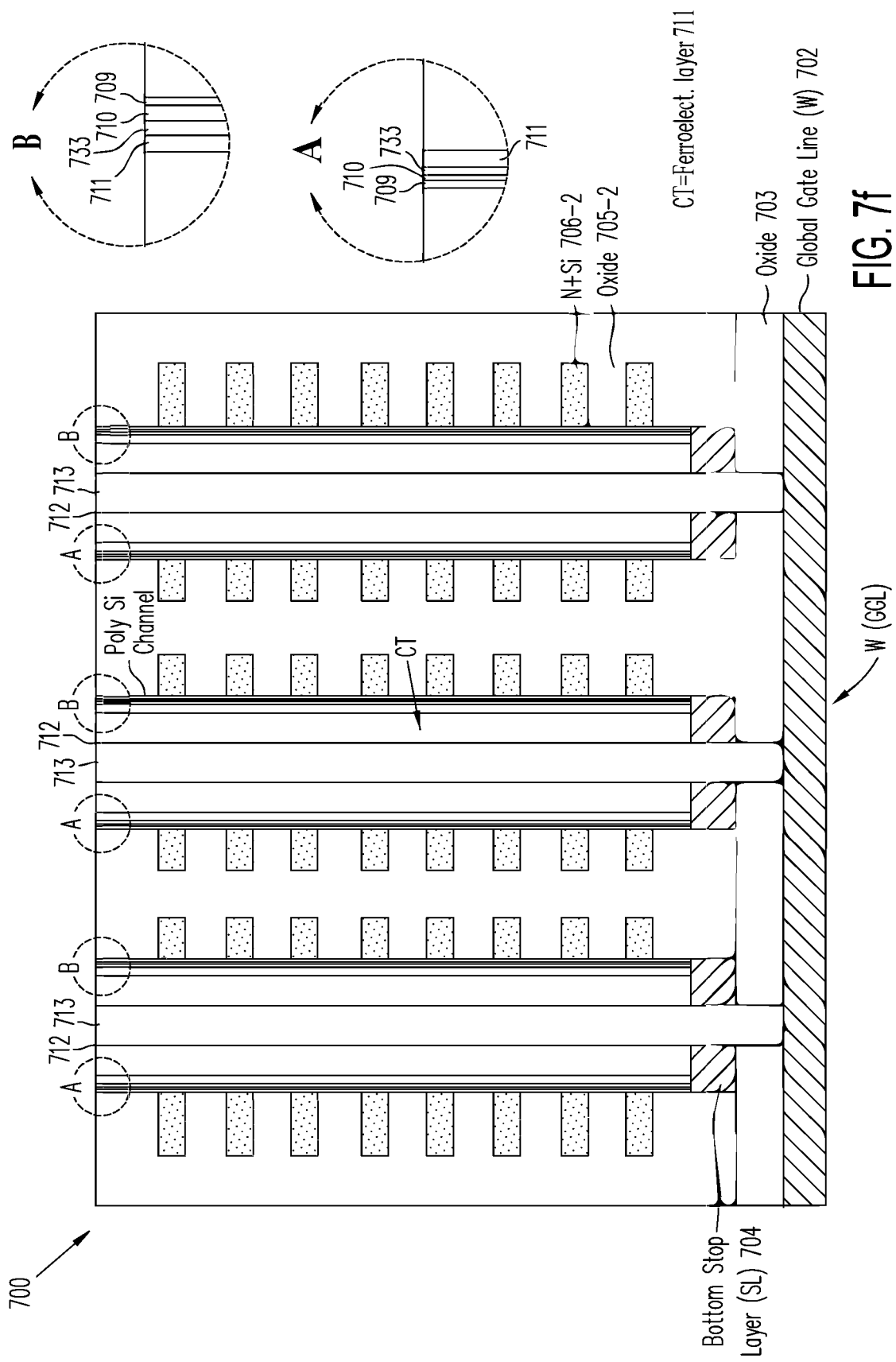

Ferroelectric layer 711 (e.g., a Si-doped or Zr-doped $Hf_{1-x}Si_xO_y$, $Hf_{1-x}Zr_xO_y$ ferroelectric thin-film) is then deposited. CMP and a bottom etch step removes excess ferroelectric material from the top of the structure and the bottom of memory holes 707. An adhesion/barrier layer of titanium nitride (TiN) 712 is then conformally deposited. An etch step then removes the TiN material from the portion of memory holes 707. Memory holes 707 are then filled with gate electrode material 713, which may be a CVD W or an n⁺ polysilicon. Excess deposited material is then removed by CMP from the top of the structure. The resulting structure (vertical section) is shown in FIG. 7*f*.

Figure 7G:
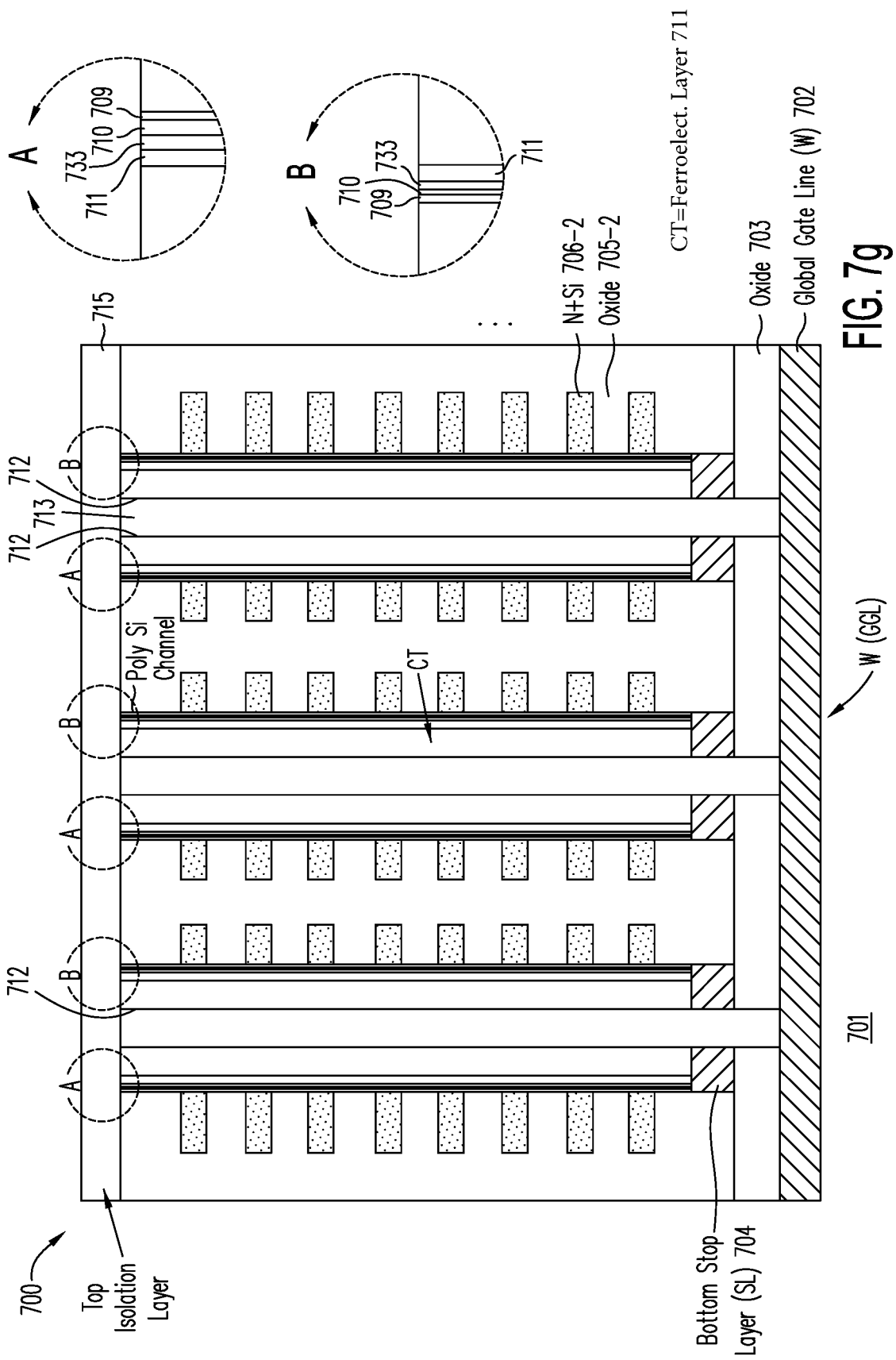

Thereafter, top isolation layer 715 (e.g., silicon nitride) is provided over memory array 700. The resulting structure (vertical section) is shown in FIG. 7*g*.

The above detailed description is provided to illustrate specific embodiments of the present invention and is not intended to be limiting. Numerous variations and modifications within the scope of the present invention are possible. For example, with respect to FIGS. 7*a*-7*g*, the locations of ferroelectric layer 711 and charge-trapping layer 733 can be swapped, and an additional blocking oxide layer can be inserted between titanium nitride layer 712 and ferroelectric layer 711. The present invention is set forth in the accompanying drawings.

I claim:

1. A memory string formed above a planar surface of a substrate, comprising:
   a gate electrode extending lengthwise along a first direction that is orthogonal to the planar surface of the substrate,
   a ferroelectric layer provided over at least a portion of the gate electrode along a second direction orthogonal to the first direction and extending lengthwise along the first direction;
   a gate oxide layer provided over at least a portion of the ferroelectric layer along the second direction and extending lengthwise along the first direction;
   a channel layer provided over at least a portion of the gate oxide layer along the second direction and extending lengthwise along the first direction; and a plurality of conductive semiconductor regions embedded in and isolated from each other by an oxide layer the conductive semiconductor regions being arrayed along the first direction, wherein the gate electrode, the ferroelectric layer, the channel layer, the gate oxide layer and each adjacent pair of semiconductor regions form a storage transistor of the memory string, and wherein the adjacent pair of semiconductor regions serve as source and drain regions of the storage transistor.

2. The memory string of claim 1, further comprising a barrier layer provided between the gate electrode and the ferroelectric layer.

3. The memory string of claim 2, wherein the barrier layer comprises titanium nitride, tungsten nitride or tantalum nitride.

4. The memory string of claim 1, wherein the gate electrode comprises tungsten or a heavily doped semiconductor.

5. The memory string of claim 1, further comprising a plurality of drain or source electrodes, each drain or source electrode being in contact with one of the source regions or one of the drain regions of the storage transistors in the memory string.

6. The memory string of claim 5, wherein the drain or source electrodes each comprise tungsten or n$^+$ polysilicon.

7. The memory string of claim 5, wherein the memory string is one of a plurality of memory strings in a memory array, wherein the memory array comprises a staircase configuration providing electrical contacts to each of the source or drain electrodes.

8. The memory string of claim 5, wherein the drain or source electrodes comprise two groups provided on opposite sides of the shaft, and wherein the source or drain electrodes of one group are electrically insulated from source or drain electrodes of the other group.

9. The memory string of claim 5, wherein the memory string is one of a plurality of memory strings in a memory array, wherein the memory array comprises a network of global word line conductors each connecting the gate electrodes of a selected group of the memory strings.

10. The memory string of claim 9, wherein the network of global word line conductors is provided above the memory strings.

11. The memory string of claim 9, wherein the network of global word line conductors is provided between the memory strings and the planar surface.

12. The memory string of claim 1, wherein the ferroelectric layer comprises a $HfO_2$ ferroelectric material.

13. The memory string of claim 12, wherein the ferroelectric layer is 5.0-30.0 nm thick, preferably 8.0-20.0 nm thick.

14. The memory string of claim 12, wherein the ferroelectric layer comprises a zirconium-doped hafnium silicon oxide.

15. The memory string of claim 14, wherein the zirconium-doped hafnium silicon oxide has a zirconium content of 40-60%, preferably 45-55%.

16. The memory string of claim 14, wherein the zirconium-doped hafnium silicon oxide comprises $Hf_xZr_{1-x}O_y$ ferroelectric thin-films, where x ranges between 0.4 and 0.6, preferably between 0.45 and 0.55, and y ranges between 1.8 and 2.2, preferably between 1.9 to 2.1.

17. The memory string of claim 14, wherein the zirconium-doped hafnium silicon oxide is prepared by depositing $HfO_2$ and $ZrO_2$ using an ALD layer-by-layer lamination step.

18. The memory string of claim 12, wherein the ferroelectric layer comprises a silicon-doped hafnium silicon oxide.

19. The memory string of claim 18, wherein the silicon-doped hafnium silicon oxide has a silicon content of 2.0-5.0%, preferably 2.5-4.5%.

20. The memory string of claim 18, wherein the silicon-doped hafnium silicon oxide comprises $Hf_xSi_{1-x}O_y$ ferroelectric thin-films, where x ranges from 0.02 to 0.05, preferably between 0.025 and 0.04, and y ranges from 1.8 to 2.2, preferably between 1.9 and 2.1.

21. The memory string of claim 18, wherein the silicon-doped hafnium silicon oxide is prepared by depositing $HfO_2$ and $SiO_2$ using an ALD layer-by-layer lamination step.

22. The memory string of claim 1, further comprising a charge-trapping layer between the gate oxide layer and the ferroelectric layer or between the ferroelectric layer and a barrier layer adjacent the gate electrode.

* * * * *